United States Patent
Araumi et al.

(10) Patent No.: US 11,876,441 B2
(45) Date of Patent: Jan. 16, 2024

(54) SWITCHING CONTROL CIRCUIT AND RESONANT CONVERTER

(71) Applicant: FUJI ELECTRIC CO., LTD., Kawasaki (JP)

(72) Inventors: Ryuunosuke Araumi, Tokyo (JP); Ryuji Yamada, Tokyo (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 178 days.

(21) Appl. No.: 17/585,264

(22) Filed: Jan. 26, 2022

(65) Prior Publication Data
US 2022/0302824 A1    Sep. 22, 2022

(30) Foreign Application Priority Data
Mar. 17, 2021 (JP) .................. 2021-043192

(51) Int. Cl.
*H02M 3/158* (2006.01)
*H02M 3/00* (2006.01)
*H03K 17/687* (2006.01)

(52) U.S. Cl.
CPC ............. *H02M 3/01* (2021.05); *H02M 3/158* (2013.01); *H03K 17/687* (2013.01)

(58) Field of Classification Search
CPC ....... H02M 3/01; H02M 3/158; H03K 17/687
See application file for complete search history.

(56) References Cited

U.S. PATENT DOCUMENTS

| 11,258,368 B2 * | 2/2022 | Jiang | H02M 1/0016 |
| 2009/0184698 A1 * | 7/2009 | Nishikawa | H02M 3/33571 |
| | | | 323/282 |
| 2015/0016152 A1 * | 1/2015 | Kojima | H02M 3/01 |
| | | | 363/21.02 |
| 2015/0381055 A1 * | 12/2015 | Ohtake | H02M 3/3376 |
| | | | 363/21.02 |
| 2017/0373604 A1 * | 12/2017 | Chen | H02M 1/36 |
| 2018/0054134 A1 * | 2/2018 | Moon | H02M 1/08 |
| 2018/0191252 A1 * | 7/2018 | Bianco | H02M 1/08 |

FOREIGN PATENT DOCUMENTS

| JP | 2005-198456 A | 7/2005 |
| JP | 2005-198457 A | 7/2005 |
| WO | 2012/105077 A1 | 8/2012 |

* cited by examiner

*Primary Examiner* — Rafael O De Leon Domenech
(74) *Attorney, Agent, or Firm* — Rabin & Berdo, P.C.

(57) ABSTRACT

A switching control circuit controls switching of a switching device, which controls a resonance current of a resonant converter, with a frequency corresponding to an output voltage of the resonant converter. The switching control circuit includes a detection circuit configured to detect a difference between a first timing at which the switching device is turned on and a second timing at which a polarity of the resonance current reverses, and a signal output circuit configured to output a driving signal with a preset minimum frequency, responsive to the difference becoming so small as to satisfy a predetermined condition.

11 Claims, 13 Drawing Sheets

SWITCHING CONTROL CIRCUIT AND RESONANT CONVERTER

CROSS-REFERENCE TO RELATED APPLICATION

The present application claims priority pursuant to 35 U.S.C. § 119 from Japanese patent application number 2021-043192 filed on Marc. 17, 2021, the entire disclosure of which is incorporated by reference herein.

BACKGROUND

Technical Field

The present disclosure relates to a switching control circuit and a resonant converter.

For resonant converters, there is a case where, when the switching frequency enters a capacitive load region, the resonant condition deviate from an expected condition (i.e., off-resonance), and a through-current flows from the power supply to the ground. To address this, there are circuits that prevent off-resonance (e.g., see Japanese Patent Application Publication Nos. 2005-198456 and 2005-198457, and International Publication No. WO2012/105077).

Incidentally, the above circuits that prevent off-resonance detect the magnitude of the resonance current and control the switching device of the resonant converter to prevent off-resonance. However, these circuits may fail to prevent off-resonance when the resonance current becomes small.

SUMMARY

A first aspect of an embodiment of the present disclosure is a switching control circuit that controls switching of a switching device which controls a resonance current of a resonant converter, with a frequency in response to an output voltage of the resonant converter, the switching control circuit comprising: a detection circuit configured to detect a difference between a first timing at which the switching device is turned on and a second timing at which polarity of the resonance current reverses; and a signal output circuit configured to output driving signal with a preset minimum frequency, responsive to the difference becoming so small as to satisfy a predetermined condition.

A second aspect of an embodiment of the present disclosure is a resonant converter comprising: a switching device; and a switching control circuit configured to control switching of the switching device with a frequency in response to an output voltage of the resonant converter, wherein the switching control circuit includes a detection circuit configured to detect a difference between a first timing at which the switching device is turned on and a second timing at which a polarity of a resonance current reverses, and a signal output circuit configured to output a driving signal with a preset minimum frequency, responsive to the difference becoming so small as to satisfy a predetermined condition.

DETAILED DESCRIPTION

At least following matters will become apparent from the descriptions of the present specification and the accompanying drawings.

Present Embodiment

Overview of Switching Power Supply Circuit 10

Figure 1:
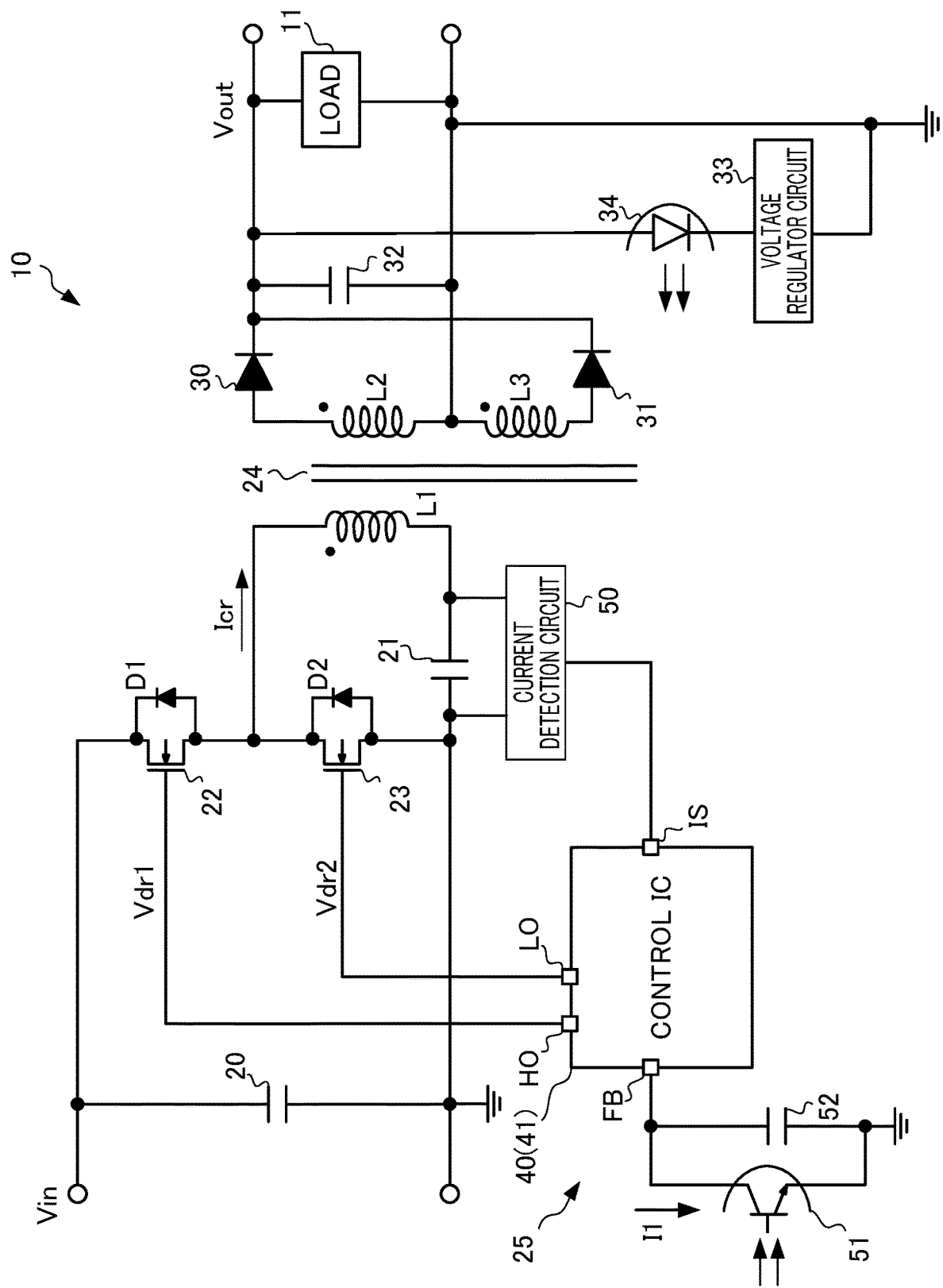
FIG. 1 is a diagram illustrating a configuration of a switching power supply circuit 10 as an example of a resonant converter.

FIG. 1 is a diagram illustrating an example of the configuration of a switching power supply circuit 10 representing an embodiment of the present invention. The switching power supply circuit 10 is an LLC resonant converter as an example of a resonant converter that generates an output voltage Vout of a target level for a load 11 from a predetermined input voltage Vin.

The switching power supply circuit 10 includes capacitors 20, 21, and 32, NMOS transistors 22 and 23, a transformer 24, a control block 25, diodes 30 and 31, a voltage regulator circuit 33, and a light emitting diode 34.

The capacitor 20 stabilizes the voltage between a power supply line to which the input voltage Vin is applied and a ground line to which a ground voltage GND is applied, to remove noise and the like. Note that the input voltage Vin is a DC voltage of a predetermined level.

The capacitor 21 is a so-called resonance capacitor forming a resonant circuit with a primary coil L1 and leakage inductance of the transformer 24. Note that illustration of the leakage inductance is omitted in FIG. 1.

The NMOS transistor 22 is a high-side power transistor, while the NMOS transistor 23 is a low-side power transistor. Note that the NMOS transistor 22 corresponds to "first switching device", and the NMOS transistor 23 corresponds to "second switching device". Also, the NMOS transistors 22 and 23 correspond to "plurality of the switching devices".

A diode D1 is the body diode of the NMOS transistor 22, and a diode D2 is the body diode of the NMOS transistor 23. Moreover, the diodes D1 and D2 operate as so-called freewheeling diodes.

Note that in this embodiment, the NMOS transistors 22 and 23 are used as switching devices. Instead, PMOS transistors, bipolar transistors, or insulated-gate bipolar transistors (IGBTs) may be used, for example.

In the case of bipolar transistors, each bipolar transistor has an external diode coupled in inverse parallel as a freewheeling diode, instead of the body diode of an NMOS transistor. Note that "coupling in inverse parallel" refers to a configuration of parallel coupling to the NMOS transistor 22 or the NMOS transistor 23 such that the input voltage Vin-side is the cathode and the ground voltage GND side is the anode.

The transformer 24 includes a primary coil L1 and secondary coils L2 and L3, and the primary coil L1 and the secondary coils L2 and L3 are insulated from each other. At the transformer 24, voltage is generated across the secondary coils L2 and L3 on the secondary side according to the change in the voltage between the opposite ends of the primary coil L1 on the primary side.

Also, the source terminal of the NMOS transistor 22 and the drain terminal of the NMOS transistor 23 are coupled to one end of the primary coil L1, and the source terminal of the NMOS transistor 23 is coupled to the other end of the primary coil L1 via the capacitor 21.

Thus, when the switching of the NMOS transistors 22 and 23 starts, the voltage across the secondary coils L2 and L3 starts changing. Note that the primary coil L1 and the secondary coils L2 and L3 are electromagnetically coupled to each other with the same polarity.

The control block 25 is a circuit block for controlling the switching of the NMOS transistors 22 and 23. Details will be described later.

The diodes 30 and 31 rectify the voltage across the secondary coils L2 and L3, and the capacitor 32 smooths the rectified voltage. As a result, a smoothed output voltage Vout is generated at the capacitor 32. Note that the output voltage Vout is a DC voltage of the target level.

The voltage regulator circuit 33 is a circuit that generates a constant DC voltage, and is configured using a shunt regulator, for example.

The light emitting diode 34 is an element that emits light of an intensity in response to the difference between the output voltage Vout and the output of the voltage regulator circuit 33, and forms a photocoupler with a phototransistor 51 to be described later. In this embodiment, the intensity of the light from the light emitting diode 34 becomes higher as the level of the output voltage Vout becomes higher.

Note that, although a configuration in which the primary coil L1 and the capacitor 21 coupled in series are coupled in parallel to the NMOS transistor 23 has been described, the primary coil L1 and the capacitor 21 coupled in series may be coupled in parallel to the NMOS transistor 22.

Control Block 25

The control block 25 includes a control IC 40, a current detection circuit 50, the phototransistor 51, and a capacitor 52.

The control IC 40 is an integrated circuit that controls the switching of the NMOS transistors 22 and 23, and has terminals FB, IS, HO, and LO.

The terminal FB is a terminal where a feedback voltage Vfb in response to the output voltage Vout is generated, and to which the phototransistor 51 and the capacitor 52 are coupled. The phototransistor 51 causes a bias current I1, whose magnitude corresponds to the intensity of the light from the light emitting diode 34, to flow from the terminal FB to the ground, and the capacitor 52 is provided to remove noise between the terminal FB and the ground.

Thus, the phototransistor 51 operates as a transistor that generates a sink current. Also, in this embodiment, the feedback voltage Vfb drops as the output voltage Vout rises, while the feedback voltage Vfb rises as the output voltage Vout drops.

The terminal IS is a terminal where the current detection circuit 50, which detects a resonance current Icr flowing through the capacitor 21, applies a voltage Vis in response to the current value of the resonance current Icr through the primary coil L1. Note that the current detection circuit 50 detects the resonance current Icr and outputs the voltage Vis in response to the direction and magnitude of the resonance current Icr. Incidentally, as illustrated in FIG. 1, the direction of the resonance current is such that the direction of flow from the primary coil L1 toward the capacitor 21 is positive.

The configuration of this current detection circuit 50 is not particularly limited, but one example is a configuration in which a resistor and a capacitive element are coupled in series. The connecting point between the resistor and the capacitive element is coupled to the terminal IS. As another configuration, a configuration in which two resistors are coupled in series may be employed, in which case the connecting point between the resistors is coupled to the terminal IS.

The terminal HO is a terminal from which a signal Vdr1 for driving the NMOS transistor 22 is output, and to which the gate terminal of the NMOS transistor 22 is coupled.

The terminal LO is a terminal from which a signal Vdr2 for driving the NMOS transistor 23 is output, and to which the gate terminal of the NMOS transistor 23 is coupled. Also, the signals Vdr1 and Vdr2 are pulsive signals whose duty ratios are basically constant (e.g., at 50%). Note that the control IC 40 corresponds to "switching control circuit".

Figure 2:
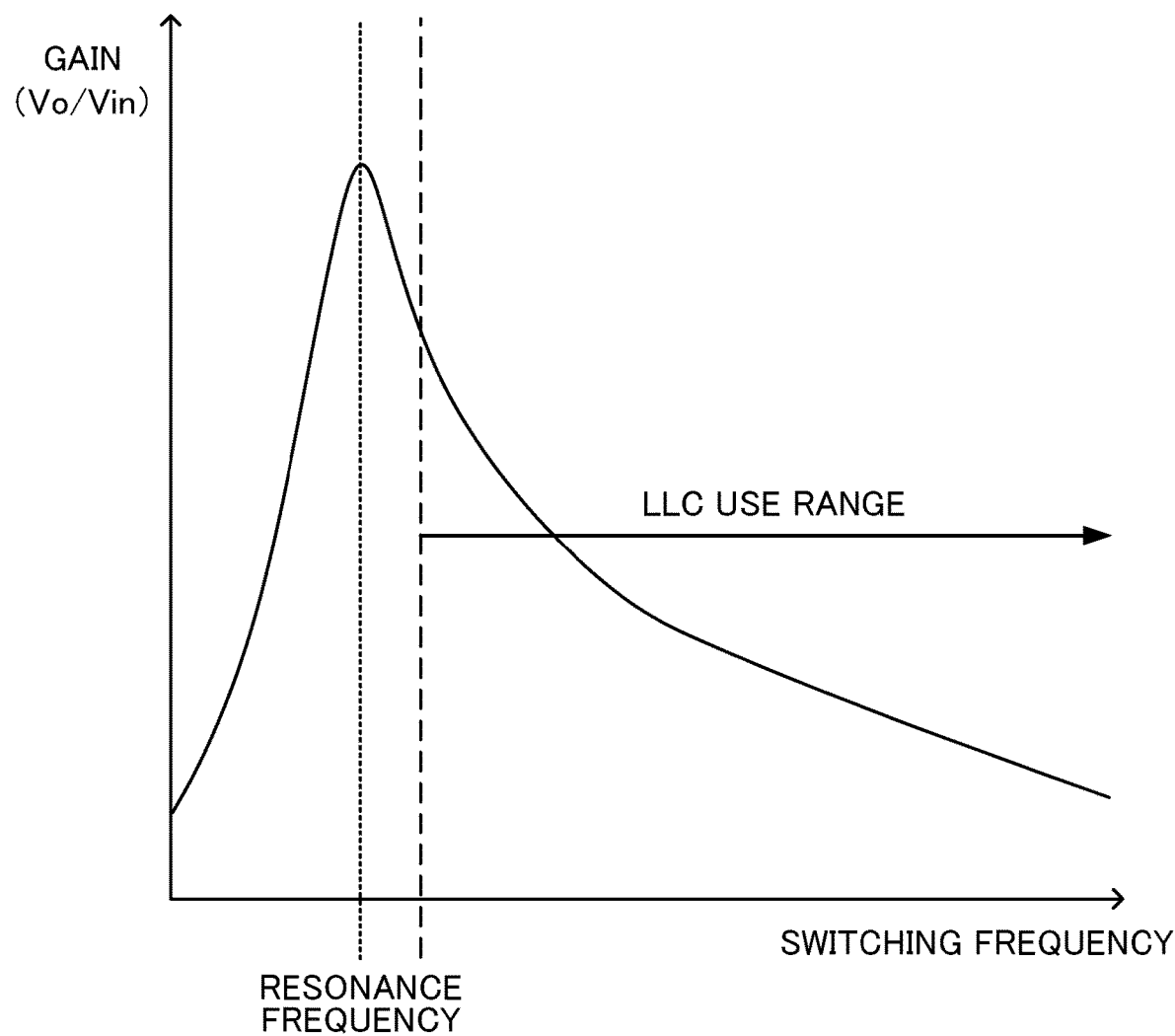
FIG. 2 is a diagram illustrating a relationship between the switching frequency and gain of the switching power supply circuit 10.

Relationship Between Switching Frequency of
Switching Power Supply Circuit 10 and
Off-Resonance FIG. 2 is a diagram illustrating a relationship between the switching frequency and gain of the switching power supply circuit 10. Since the switching power supply circuit 10 is an LLC resonant converter, the gain (=Vout/Vin) and switching frequency of the switching power supply circuit 10 satisfy the relationship in FIG. 2, for example.

Note that the relationship in FIG. 2 varies depending on the state of the load 11, the excitation inductance of the transformer 24, the current value of the inductor current, the temperature condition, and so on. For this reason, the switching frequency from which what is called off-resonance occurs varies depending on the operating condition and design condition of the switching power supply circuit 10. This makes it difficult to figure out the switching frequency from which off-resonance occurs beforehand.

In this embodiment, the control IC 40 sets the switching frequency above the resonance frequency of the switching power supply circuit 10 based on the phase difference between the voltage applied to the resonant circuit and the resonance current Icr, in order to more reliably prevent off-resonance. Specifically, the control IC 40 controls the switching frequency in a range slightly higher than the resonance frequency so that the switching frequency can be within the LLC use range in FIG. 2.

Also, as will be described later in detail, the control IC 40 changes the frequency of the signals Vdr1 and Vdr2 based on the feedback voltage Vfb such that the output voltage Vout can be at the target level. Specifically, the control IC 40 raises the frequency of the signals Vdr1 and Vdr2 when the output voltage Vout rises and the feedback voltage Vfb thus drops. As a result, the gain of the switching power supply circuit 10 drops, and the output voltage Vout drops.

On the other hand, the control IC 40 lowers the frequency of the signals Vdr1 and Vdr2 when the output voltage Vout drops and the feedback voltage Vfb thus rises. As a result, the gain of the switching power supply circuit 10 rises, and the output voltage Vout rises. The switching power supply circuit 10 is capable of generating the output voltage Vout of the target level in this manner.

Through-Current Flowing Due to Occurrence of Off-Resonance

Figure 3:
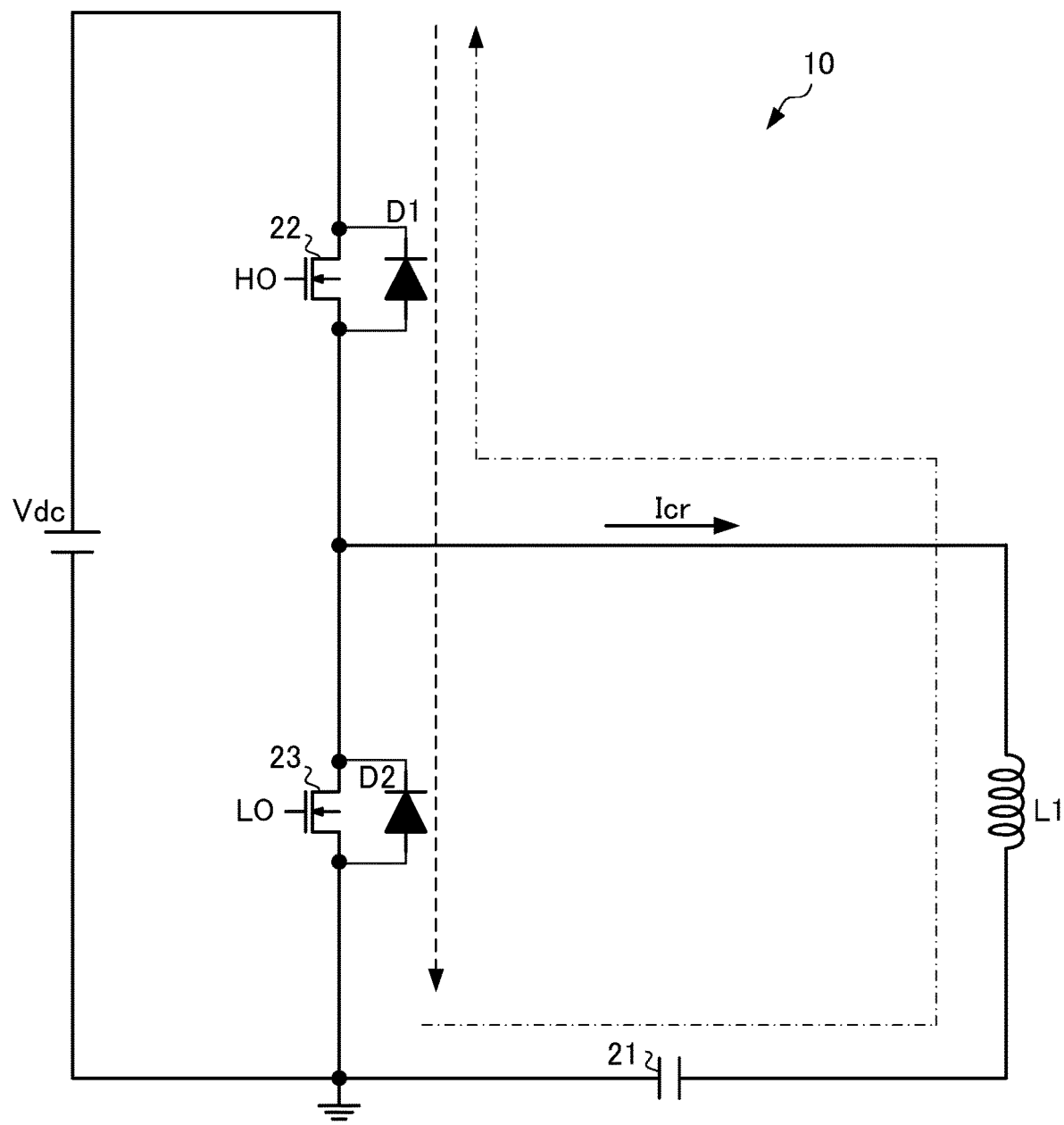
FIG. 3 is a diagram explaining a through-current generated when off-resonance occurs during steady operation.

Incidentally, when, for example, the input voltage Vin or the output voltage Vout changes while the switching power supply circuit 10 is in steady operation, a phenomenon in which the frequency of the signals Vdr1 and Vdr2 decreases below a predetermined resonance frequency, i.e., off-resonance, occurs in some cases. FIG. 3 is a diagram illustrating a through-current that flows due to the occurrence of off-resonance while the switching power supply circuit 10 is in steady operation. Note that the direction of the resonance current Icr is positive in the case where the resonance current Icr flows in the direction of the arrow.

First, as indicated by the dashed and single-dotted line in FIG. 3, the direction of the resonance current Icr changes from positive to negative, so that the resonance current Icr in the negative direction flows through the NMOS transistor 22. Thereafter, when the NMOS transistor 22 is turned off and the NMOS transistor 23 is turned on, a through-current flows through the NMOS transistor 23, as indicated by the dotted line in FIG. 3, due to the reverse recovery characteristic of the diode D1. Note that although FIG. 3 illustrates a phenomenon in which a through-current flows through the NMOS transistor 23, a similar phenomenon occurs on the NMOS transistor 22 as well when off-resonance occurs.

The voltage at the capacitor 21 is substantially Vin/2 during steady operation as mentioned above. During non-steady operation (e.g., during startup), on the other hand, the voltage at the capacitor 21 is not Vin/2. This leads to a possibility that the capacitor 21 is charged and discharged with the resonance current Icr flowing in one direction irrespective of the ON and OFF of the NMOS transistors 22 and 23.

Figure 4:
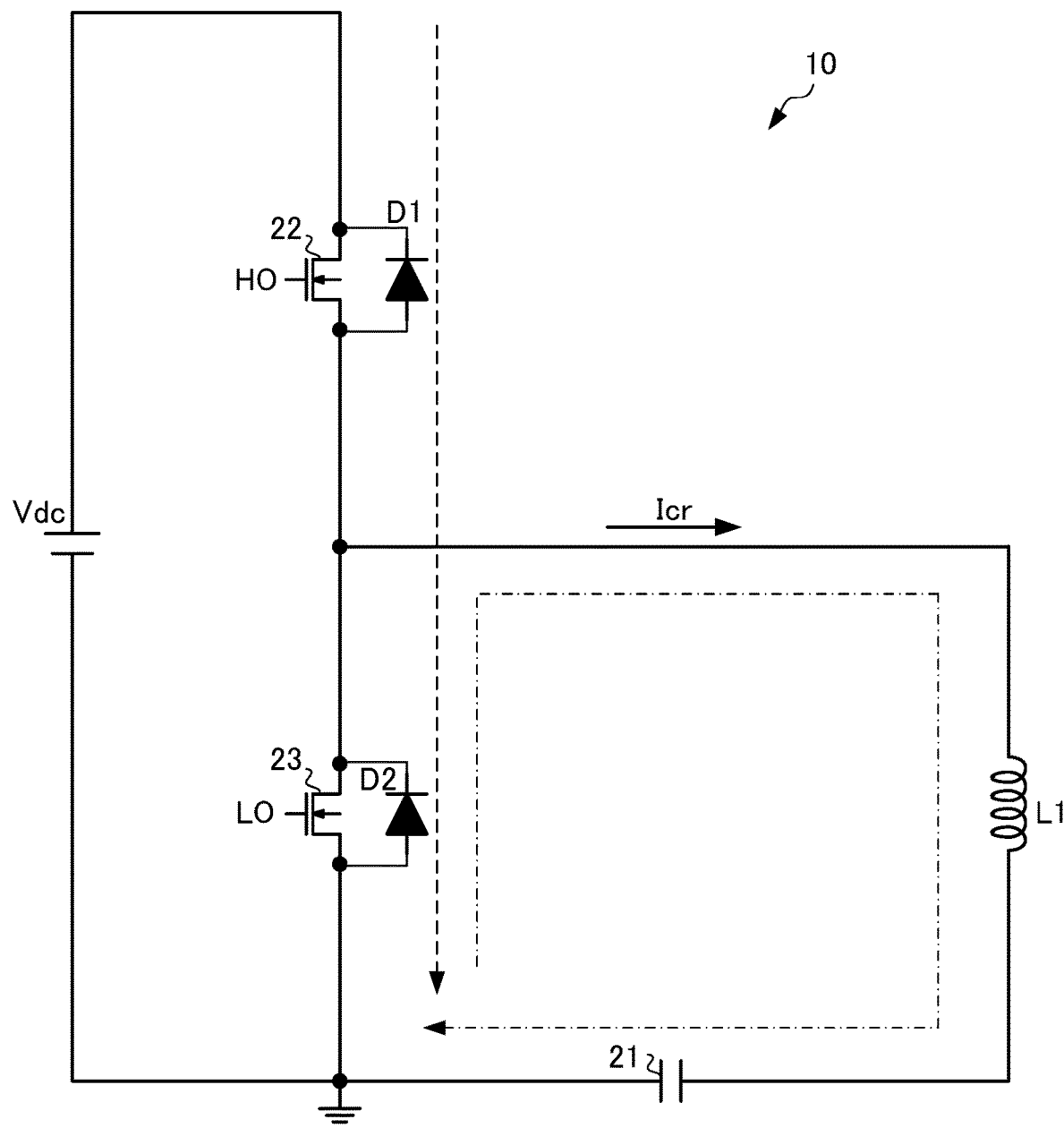
FIG. 4 is a diagram explaining a through-current generated when off-resonance occurs during non-steady operation.

If off-resonance occurs in this state, a through-current may flow as during steady operation. FIG. 4 is a diagram illustrating a through-current that flows due to the occurrence of off-resonance during a startup of the switching power supply circuit 10.

With reference to FIG. 4, a description will be given for a case where the resonance current Icr flows in the positive direction during a startup without the voltage at the capacitor 21 having reached Vin/2. First, the NMOS transistor 22 is turned on when the direction of the resonance current Icr is positive after the NMOS transistor 23 is turned on and then turned off, as indicated by the dashed and single-dotted line in FIG. 4. Then, as indicated by the dotted line in FIG. 4, a through-current flows through the NMOS transistor 22 due to the reverse recovery characteristic of the diode D2. Note that although FIG. 4 explains a phenomenon in which a through-current flows through the NMOS transistor 22, a similar phenomenon occurs on the NMOS transistor 23 as well when off-resonance occurs with the resonance current Icr flowing in the negative direction at the startup.

Configuration of Control IC 40

Figure 5:
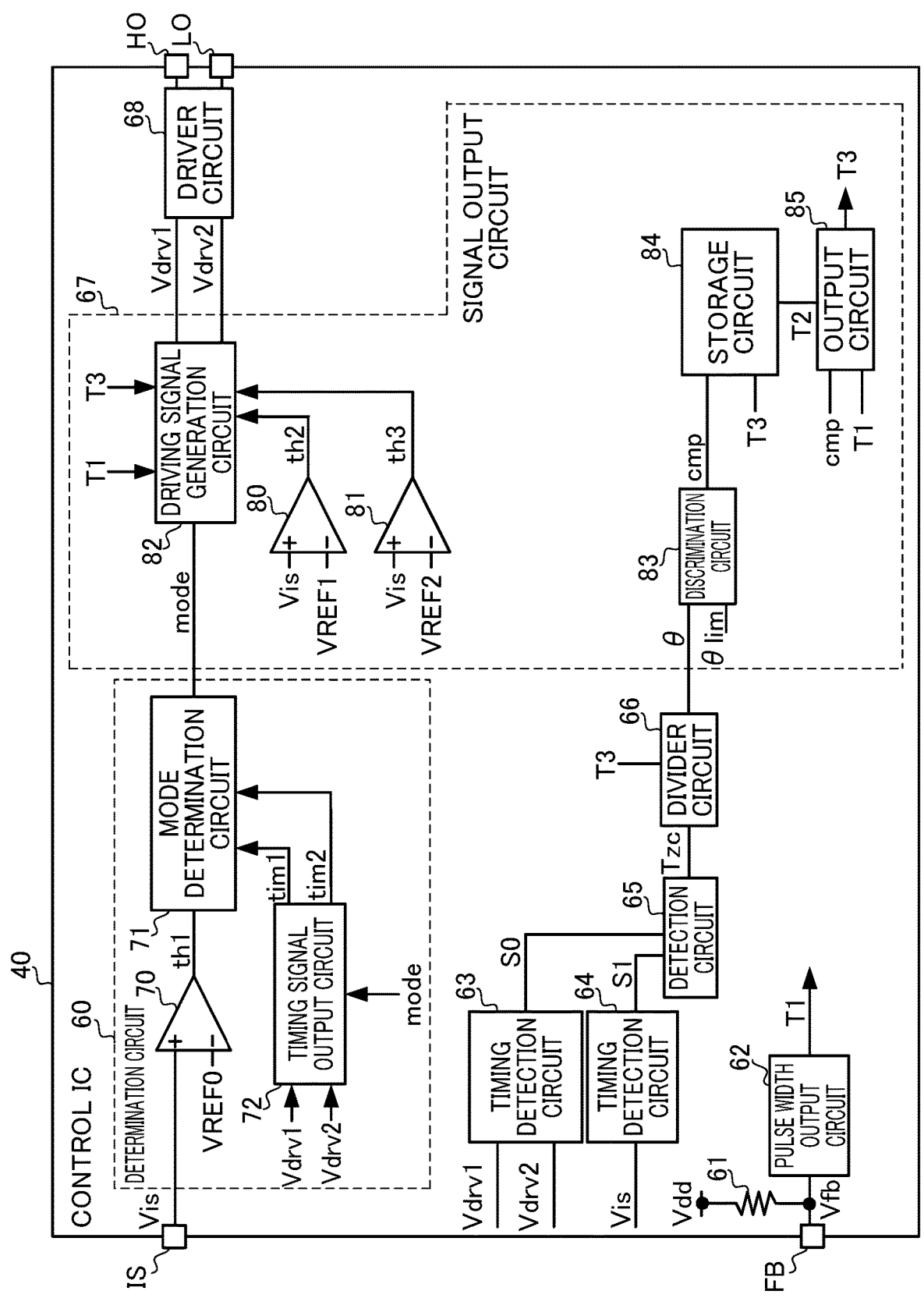
FIG. 5 is a diagram illustrating an example of the configuration of a control IC 40.

FIG. 5 is a diagram illustrating an example of the control IC 40. The control IC 40 is a circuit that switches the NMOS transistors 22 and 23 based on the voltage Vis and the voltage Vfb. The control IC 40 includes a determination circuit 60, a resistor 61, a pulse width output circuit 62, timing detection circuits 63 and 64, a detection circuit 65, a divider circuit 66, a signal output circuit 67, and a driver circuit 68.

Note that the resistor 61 is a resistor for pulling up the voltage at the terminal FB from a power supply voltage Vcc to a voltage Vdd generated by an internal circuit (not illustrated), and generates a voltage Vfb that varies according to the bias current I1 of the phototransistor 51.

Determination Circuit 60

The determination circuit 60 is a circuit that determines the operation mode of the switching power supply circuit 10.

The determination circuit 60, based on the resonance current Icr, determines the operation mode in which the switching power supply circuit 10 operates between "mode A" for a steady state (i.e., "steady mode") or "mode B" for a state different from the steady state (i.e., "non-steady mode"). Specifically, the determination circuit 60 determines the operation mode of the switching power supply circuit 10 based on whether the voltage Vis in response to the resonance current Icr is higher than or lower than a reference voltage VREF0 when timing signals tim1 and tim2 are input from a timing signal output circuit 72 which will be described later. The determination circuit 60 includes a comparator 70, a mode determination circuit 71, and the timing signal output circuit 72.

The comparator 70 compares the voltage Vis in response to the resonance current Icr and the reference voltage VREF0 for detecting the direction of the resonance current Icr, and outputs a signal th1 indicating the direction of the resonance current Icr. Here, the level of the reference voltage VREF0 is the level of the voltage Vis at a point where the resonance current Icr is zero.

When the voltage Vis is higher than the reference voltage VREF0, the comparator 70 outputs a high-level (hereinafter "H"-level) signal th1 indicating that the direction of the resonance current Icr is positive. On the other hand, when the voltage Vis is lower than the reference voltage VREF0, the comparator 70 outputs a low-level (hereinafter "L"-level) signal th1 indicating that the direction of the resonance current Icr is negative.

The comparator 70 detects the direction of the resonance current Icr on the assumption that the direction of the resonance current Icr from the connecting point between the NMOS transistors 22 and the NMOS transistors 23 to the resonant circuit of the switching power supply circuit 10 is positive and the direction of the resonance current Icr from the resonant circuit to the connecting point is negative. Note that the comparator 70 corresponds to "direction detection circuit".

At each rising edge of the timing signal tim1, the mode determination circuit 71 determines that the switching power supply circuit 10 is in "mode A" operation if the "H"-level signal th1 has been input and determines that the switching power supply circuit 10 is in "mode B" operation if the "L"-level signal th1 has been input.

On the other hand, at each rising edge of the timing signal tim2, the mode determination circuit 71 determines that the switching power supply circuit 10 is in "mode A" operation if the "L"-level signal th1 has been input and determines that the switching power supply circuit 10 is in "mode B" operation if the "H"-level signal th1 has been input.

Also, the mode determination circuit 71 outputs an "H"-level signal mode if the switching power supply circuit 10 is in "mode A" operation, and outputs an "L"-level signal mode if the switching power supply circuit 10 is in "mode B" operation.

Also, the switching power supply circuit 10 is in a steady state when the switching power supply circuit 10 is in "mode A" operation. On the other hand, the switching power supply circuit 10 is not in a steady state when the switching power supply circuit 10 is in "mode B" operation. Note that "mode A" corresponds to "first mode", and "mode B" corresponds to "second mode".

The timing signal output circuit 72, based on a pulse width input thereto, generates the timing signal tim1 when a driving signal Vdrv1 is an "H" level, and generates the timing signal tim2 when a driving signal Vdrv2 is an "H" level. Also, the input pulse width is "pulse width T3" from an output circuit 85 which will be described later when the switching power supply circuit 10 is in "mode A" operation. The input pulse width is "pulse width T1" from the pulse width output circuit 62 which will be described later when the switching power supply circuit 10 is in "mode B" operation.

Description of Timings to Generate Timing Signals Tim1 and Tim2

Figure 6:
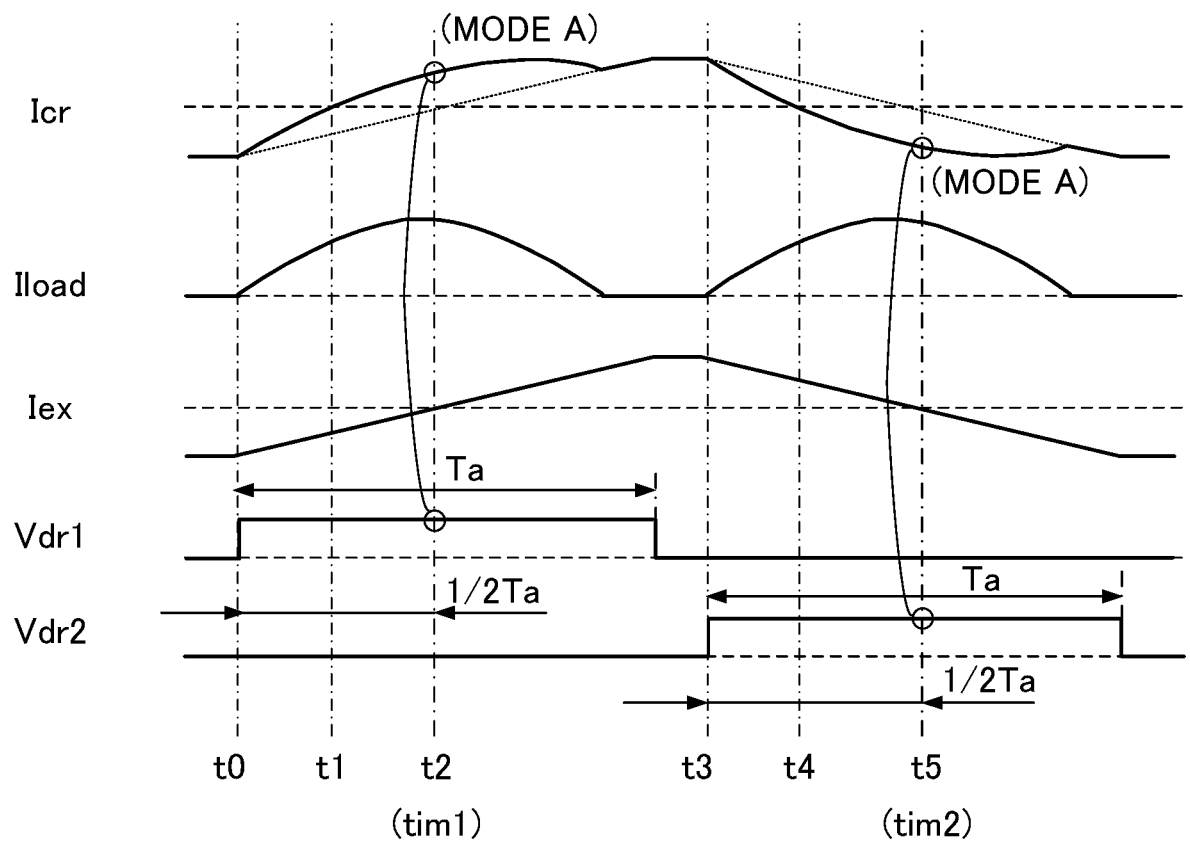
FIG. 6 is a diagram illustrating an example of the timings at which a timing signal output circuit 72 generates timing signals tim1 and tim2.

FIG. 6 is a diagram illustrating an example of the timings at which the timing signal output circuit 72 generates the timing signals tim1 and tim2. Note that this diagram exemplarily illustrates the waveform of the resonance current Icr when the switching power supply circuit 10 is in steady operation (i.e., in "mode A" operation). Note that in FIG. 6, "pulse width Ta" represents a period in which the control IC 40 outputs an "H"-level signal Vdr1 or an "H"-level signal Vdr2 and the NMOS transistor 22 or 23 is thus turned on.

First, at a time t0, the "H"-level signal Vdr1 is output from the terminal H0. At a time t1, the resonance current Icr changes from the negative direction to the positive direction. Here, since the resonance current Icr is the sum of a load current Iload and an excitation current Iex, the load current Iload decreases as the state of the load 11 shifts toward a lighter load state. Accordingly, the time t1 shifts to a later point. Hence, in the case where the switching power supply circuit 10 is in steady operation (i.e., in "mode A" operation), the time t1 delays the most when the load current Iload does not flow.

At a time t2, the excitation current Iex changes from the negative direction to the positive direction. The switching frequency is determined based on the voltage Vfb in response to the output voltage Vout. Moreover, assuming that the ON duty ratio of the NMOS transistors 22 and 23 is 50%, the time t2, at which the excitation current Iex changes from the negative direction to the positive direction, is at a point within "pulse width Ta" at the end of a period of ½ Ta from the change to the "H" level (the center of the pulse width Ta).

Here, if the resonance current Icr does not change from the negative direction to the positive direction at the center of "pulse width Ta", the average value of the voltage at the capacitor 21 is less than or equal to ½ of a DC power supply Vdc during non-steady operation (e.g., startup) of the switching power supply circuit 10 or the like. Thus, whether the operation mode is "mode A" or "mode B" can be determined by generating the timing signal tim1 to determine the direction of the resonance current Icr at the time t2, which is the center of "pulse width Ta". Incidentally, the timing to generate the timing signal tim1 may be after ½ (after the center) of "pulse width Ta".

The timing signal tim2 is generated similarly to the timing signal tim1. The timing to generate the timing signal tim2 will be described below.

At a time t3, which corresponds to the time t0, the "H"-level signal Vdr2 is output from the terminal L0. At a time t4, which corresponds to the time t1, the resonance current Icr changes from the positive direction to the negative direction. Then, at a time t5, which corresponds to the time t2, the excitation current Iex changes from the positive direction to the negative direction.

Here, as with the timing signal tim1, whether the operation mode is "mode A" or "mode B" can be determined by generating the timing signal tim2 to determine the direction of the resonance current Icr at the time t5, which is the center of "pulse width Ta". Incidentally, as with the timing signal tim1, the timing to generate the timing signal tim2 may be after ½ (after the center) of "pulse width Ta". Note that the timing at which the timing signal tim1 is generated corresponds to "third timing", and the timing at which the timing signal tim2 is generated corresponds to "fourth timing".

Pulse Width Output Circuit 62

Referring to FIG. 5 again, the pulse width output circuit outputs information indicating "pulse width T1" of the driving signals Vdrv1 and Vdrv2 for bringing the output voltage Vout to the target level, based on the voltage Vfb in response to the output voltage Vout.

More specifically, when the output voltage Vout rises and the feedback voltage Vfb thus drops, the pulse width output circuit 62 outputs a signal with a narrower pulse width T1 in order to increase the frequency of the signals Vdr1 and Vdr2. As a result, the gain of the switching power supply circuit 10 decreases, and the output voltage Vout drops.

On the other hand, when the output voltage Vout drops and the feedback voltage Vfb thus rises, the pulse width output circuit 62 outputs a signal with a wider pulse width T1 in order to decrease the frequency of the signals Vdr1 and Vdr2. As a result, the gain of the switching power supply circuit 10 rises, and the output voltage Vout rises. The switching power supply circuit 10 generates the output voltage Vout of the target level in this manner.

The pulse width output circuit 62 in this embodiment includes, for example, a counter that outputs, as "pulse width T1", a count value that changes according to the voltage Vfb. Alternatively, the pulse width output circuit 62 may execute a predetermined computation process and output information indicating "pulse width T1" in response to the voltage Vfb.

Timing Detection Circuit 63

The timing detection circuit 63 is a circuit that detects the timings at which the driving signals Vdrv1 and Vdrv2 rise. Specifically, the timing detection circuit 63 outputs a signal S0 obtained by logically ORing the driving signals Vdrv1 and Vdrv2. Note that while the signal S0 is a signal obtained by logically ORing the driving signals Vdrv1 and Vdrv2 in this embodiment, the signal S0 may be a pulse signal generated based on the rising edge of the driving signal Vdrv1 or Vdrv2. Note that the timing of the rising edge of the driving signal Vdrv1 or Vdrv2 corresponds to "first timing".

Timing Detection Circuit 64

The timing detection circuit 64 is a circuit that detects the timing at which the polarity of the resonance current Icr changes. Specifically, with a comparator (not illustrated), the timing detection circuit 64 compares the voltage Vis and the reference voltage VREF0 indicating the voltage Vis when the polarity of the resonance current Icr changes. The timing detection circuit 64 then detects when the polarity of the voltage Vis changes, and outputs a signal S1 representing a result of detecting the polarity of the voltage Vis. Note that "when the polarity of the resonance current Icr changes" means when the direction of the resonance current Icr changes from positive to negative or from negative to positive. Incidentally, the signal S1 is a signal indicating the timing at which the voltage Vis becomes zero, irrespective of the direction of the change.

Also, in this embodiment, the signal S1 is a signal obtained as a result of detecting the polarity of the voltage Vis with a comparator (not illustrated), but may be a pulse signal generated based on change in the polarity of the voltage Vis. Also, the timing at which the polarity of the resonance current Icr changes corresponds to "second timing".

Detection Circuit 65

The detection circuit 65 is a circuit that detects a period Tzc, and detects the difference between the timing at which the NMOS transistor 22 or 23 is turned on and the timing at which the polarity of the resonance current Icr changes, i.e., the period Tzc. Specifically, based on the signals S0 and S1, the detection circuit 65 detects the period Tzc from when the driving signal Vdrv1 or Vdrv2 shifts to the "H" level to when the polarity of the voltage Vis reverses. Note that the period Tzc corresponds to "difference".

Divider Circuit 66

The divider circuit 66 is a circuit that derives a phase difference θ, and outputs the phase difference θ based on the period Tzc and "pulse width T3". Specifically, the divider circuit 66 divides the period Tzc by "pulse width T3" and outputs the result of the division, or the phase difference θ. Note that "pulse width T3" is the ON period or OFF period of the NMOS transistors 22 and 23 in the case where the switching power supply circuit 10 is in "mode A" operation. Also, "pulse width T3" corresponds to "period for which the switching device is turned on or off", and the phase difference θ corresponds to "value in response to the difference".

Signal Output Circuit 67

The signal output circuit 67 is a circuit that outputs the driving signals Vdrv1 and Vdrv2, and outputs the driving signals Vdrv1 and Vdrv2 with a frequency in response to "pulse width T1" output by the pulse width output circuit 62 or the phase difference θ. Specifically, in the case where the switching power supply circuit 10 is in steady operation (i.e., in "mode A" operation), the signal output circuit 67 outputs the driving signals Vdrv1 and Vdrv2 with their minimum frequency limited when the phase difference θ becomes less than a predetermined value θlim (hereinafter "predetermined condition"). Then, when the frequency based on "pulse width T1" becomes higher than the minimum frequency, the signal output circuit 67 outputs the driving signals Vdrv1 and Vdrv2 with the frequency based on "pulse width T1".

On the other hand, in the case where the switching power supply circuit 10 is in non-steady operation (i.e., in "mode B" operation), the signal output circuit 67 outputs the driving signals Vdrv1 and Vdrv2 with the frequency based on "pulse width T1" from the pulse width output circuit 62. The signal output circuit 67 includes comparators 80 and 81, a driving signal generation circuit 82, a discrimination circuit 83, a storage circuit 84, and the output circuit 85.

Comparators 80 and 81

The comparator 80 is a circuit that detects a timing immediately before the direction of the resonance current Icr changes from the positive direction to the negative direction. Specifically, the comparator 80 compares the voltage Vis and a reference voltage VREF1 representing the voltage Vis in response to a resonance current Icr in the positive direction close to zero, and outputs an "L"-level signal th2 when the resonance current Icr gets close to zero. If the voltage Vis in response to the resonance current Icr in the positive direction is greater than the reference voltage VREF1, the comparator 80 outputs an "H"-level signal th2.

The comparator 81 is a circuit that detects a timing immediately before the resonance current Icr changes from the negative direction to the positive direction. Specifically, the comparator 81 compares the voltage Vis and a reference voltage VREF2 representing the voltage Vis in response to a resonance current Icr in the negative direction close to zero, and outputs an "H"-level signal th3 when the resonance current Icr gets close to zero. If the voltage Vis in response to the resonance current Icr in the negative direction is less than the reference voltage VREF2, the comparator 81 outputs an "L"-level signal th3. Note that in this embodiment, the level relationship among the reference voltages VREF0, VREF1, and VREF2 is VREF1>VREF0>VREF2.

As described above, in this embodiment, the reference voltages VREF1 and VREF2 are used to detect the timing immediately before the resonance current Icr changes from the positive direction to the negative direction and the timing immediately before the resonance current Icr changes from the negative direction to the positive direction. Note that in this embodiment the magnitude of the reference voltage VREF1 from the reference voltage VREF0 and the magnitude of the reference voltage VREF2 from the reference voltage VREF0 are equal but may be different. Also, the reference voltages VREF1 and VREF2 may be variable according to the DC power supply Vdc.

Driving Signal Generation Circuit 82

The driving signal generation circuit 82 outputs the driving signals Vdrv1 and Vdrv2 based on a pulse width, the signal mode, and the signals th2 and th3 input thereto. Specifically, when the signal mode indicates "mode A", the driving signal generation circuit 82 outputs the driving signals Vdrv1 and Vdrv2 with "pulse width T3". Note that the input pulse width is "pulse width T3" when the switching power supply circuit 10 is in "mode A" operation.

Also, when the signal mode indicates "mode B", the driving signal generation circuit 82 brings one of the driving signals Vdrv1 and Vdrv2 to the "H" level based on "pulse width T1" and changes it to the "L" level after the elapse of "pulse width T1".

Note that when the switching power supply circuit 10 is in "mode B" operation, a through-current is generated, as described above. For this reason, when the switching power supply circuit 10 is in "mode B" operation, the driving signal generation circuit 82 generates the driving signals Vdrv1 and Vdrv2 so as to extend a dead time therebetween so that the through-current can be prevented.

Specifically, after the driving signal Vdrv1 shifts to the "L" level, the driving signal generation circuit 82 outputs the "L"-level driving signal Vdrv2 until the resonance current Icr flows in the positive direction, that is, until the "H"-level signal th2 is input, after the elapse of a dead time. On the other hand, after the driving signal Vdrv2 shifts to the "L" level, the driving signal generation circuit 82 outputs the "L"-level driving signal Vdrv1 until the resonance current Icr flows in the negative direction, that is, until the "L"-level signal th3 is input, after the elapse of a dead time.

Note that in this embodiment, the period of extension of the dead time is determined with the signals th2 and th3, as described above, but may be determined with a timing at which the signal th1 changes (e.g., the timing at which the signal th1 changes from the "H" level to the "L" level or the timing at which the signal th1 changes from the "L" level to the "H" level). Note that the input pulse width is "pulse width T1" when the switching power supply circuit 10 is in "mode B" operation.

Discrimination Circuit 83

The discrimination circuit 83 discriminates whether the period Tzc has become so short as to satisfy the predetermined condition. Specifically, the discrimination circuit 83 compares the phase difference θ, which is based on the period Tzc, and the predetermined value θlim, and outputs a discrimination result cmp when the phase difference θ becomes less than the predetermined value θlim. The discrimination circuit 83 resets the discrimination result cmp when the phase difference θ becomes greater than the predetermined value θlim.

Storage Circuit 84

Based on the discrimination result cmp indicating that the period Tzc has become so short as to satisfy the predetermined condition, the storage circuit 84 stores the frequency of the driving signals Vdrv1 and Vdrv2 as the minimum frequency. Specifically, the storage circuit 84 stores "pulse width T3" as "pulse width T2" when the phase difference θ becomes less than the predetermined value θlim. On the other hand, when the discrimination result cmp is reset, the storage circuit 84 is reset to a pulse width wider than the pulse width based on the minimum resonance frequency of the signals Vdr1 and Vdr2 in the control IC 40. Note that the frequency based on "pulse width T2" is "minimum frequency".

Output Circuit 85

The output circuit 85 outputs the driving signals Vdrv1 and Vdrv2 with the higher frequency among the minimum frequency and the frequency in response to the output voltage Vout. Specifically, the output circuit 85 compares "pulse width T1" and "pulse width T2", and outputs the shorter pulse width as "pulse width T3". The driving signal generation circuit 82 then outputs the driving signals Vdrv1 and Vdrv2 based on "pulse width T3".

Driver Circuit 68

The driver circuit 68 drives the NMOS transistors 22 and 23 based on the driving signals Vdrv1 and Vdrv2. Specifically, the driver circuit 68 outputs the "H"-level signal Vdr1 from the terminal HO when the "H"-level driving signal Vdrv1 is input, and outputs the "L"-level signal Vdr1 from the terminal HO when the "L"-level driving signal Vdrv1 is input.

Also, the driver circuit 68 outputs the "H"-level signal Vdr2 from the terminal LO when the "H"-level driving signal Vdrv2 is input, and outputs the "L"-level signal Vdr2 from the terminal LO when the "L"-level driving signal Vdrv2 is input.

Example of Main Waveforms in Switching Power Supply Circuit 10

Figure 7:
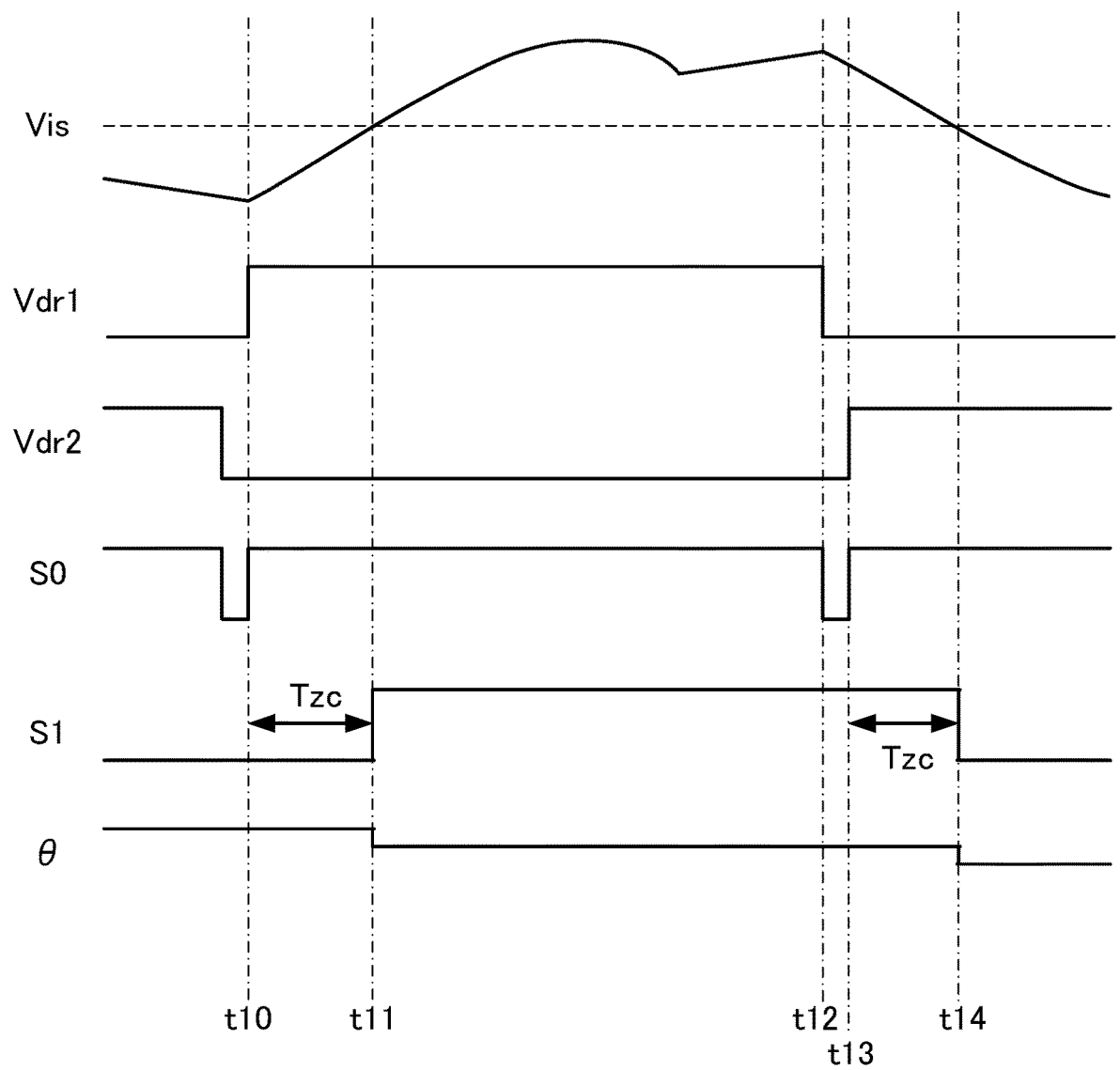
FIG. 7 is a diagram illustrating an example of main waveforms in the switching power supply circuit 10.

FIG. 7 is a diagram illustrating an example of main waveforms in the switching power supply circuit 10. Note that FIG. 7 is a diagram illustrating the voltage Vis, the waveforms of the signals Vdr1 and Vdr2, and the signals S0 and S1 output by the timing detection circuits 63 and 64 when the switching power supply circuit 10 is in "mode A" operation.

At a time t10, the control IC 40 outputs the "H"-level signal Vdr1. As a result, the resonance current Icr changes to flow in the positive direction. Also, the timing detection circuit 63 detects the driving signal Vdrv1 shifting to the "H" level and outputs an "H"-level signal S0. Moreover, the voltage Vis changes from a negative voltage to a positive voltage.

Thereafter, at a time t11, when the voltage Vis turns into a positive voltage from a negative voltage, i.e., when the polarity of the resonance current Icr changes, the timing detection circuit 64 detects that the polarity of the voltage Vis has changed, and outputs the signal S1. The detection circuit 65 detects the period Tzc from the time difference between the signal S0 from the timing detection circuit 63 and the signal S1 from the timing detection circuit 64 (i.e., the period between the time t10 and the time t11). The divider circuit 66 then divides the period Tzc by "pulse width T3" and outputs the phase difference θ. Note that when the phase difference θ becomes less than the predetermined value θlim, "pulse width T3" is set to be "pulse width T2" which corresponds to "pulse width T1" at the point when the phase difference θ becomes less than the predetermined value θlim, and when "pulse width T1" in response to the voltage Vfb becomes narrower than "pulse width T2", "pulse width T3" is set to be "pulse width T1".

At a time t12 after the elapse of "pulse width T3" from the time t10, the control IC 40 outputs the "L"-level signal Vdr1. At this time, the timing detection circuit 63 detects the "L"-level signals Vdr1 and Vdr2 and outputs an "L"-level signal S0.

Then, after the elapse of a dead time, the control IC 40 outputs the "H"-level signal Vdr2 at a time t13. At the time t13, when the control IC 40 outputs the "H"-level signal Vdr2, the resonance current Icr changes to flow in the negative direction. Also, the timing detection circuit 63 detects the "H"-level driving signal Vdrv2 and outputs the "H"-level signal S0. Moreover, the voltage Vis turns into a negative voltage from a positive voltage.

Thereafter, at the time t14, when the voltage Vis turns into a negative voltage from a positive voltage, the timing detection circuit 64 detects that the polarity of the voltage Vis has changed, and outputs the signal S1. The detection circuit 65 detects the period Tzc from the time difference between the signal S0 from the timing detection circuit 63 and the signal S1 from the timing detection circuit 64 (i.e., the period between the time t13 and the time t14). The divider circuit 66 then divides the period Tzc by "pulse width T3" and outputs the phase difference θ.

Description for Flowchart of Operation of Control IC 40

Figure 8:
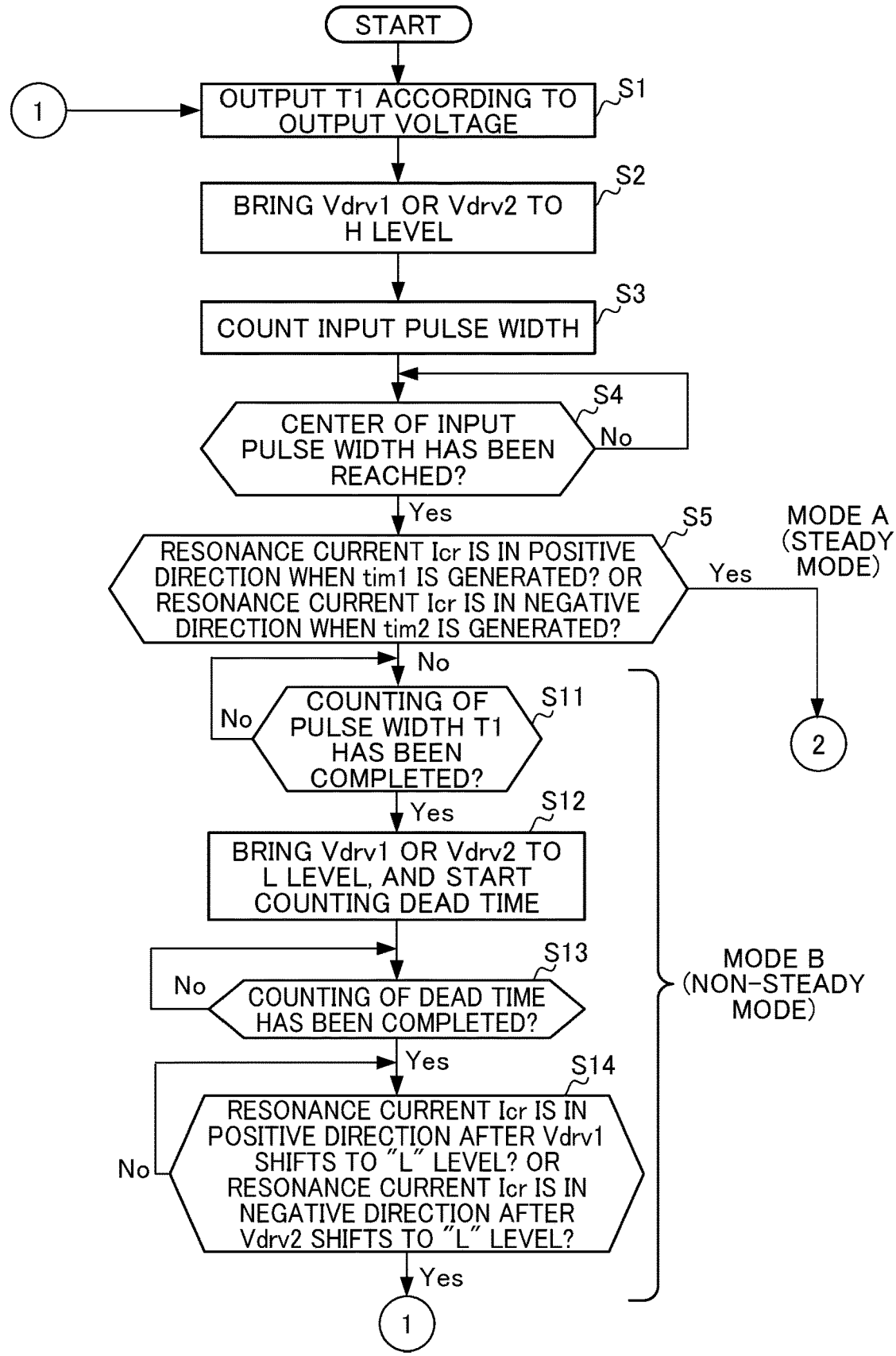
FIG. 8 is a diagram illustrating a flowchart indicating an example of the operation of the control IC 40.
Figure 9:
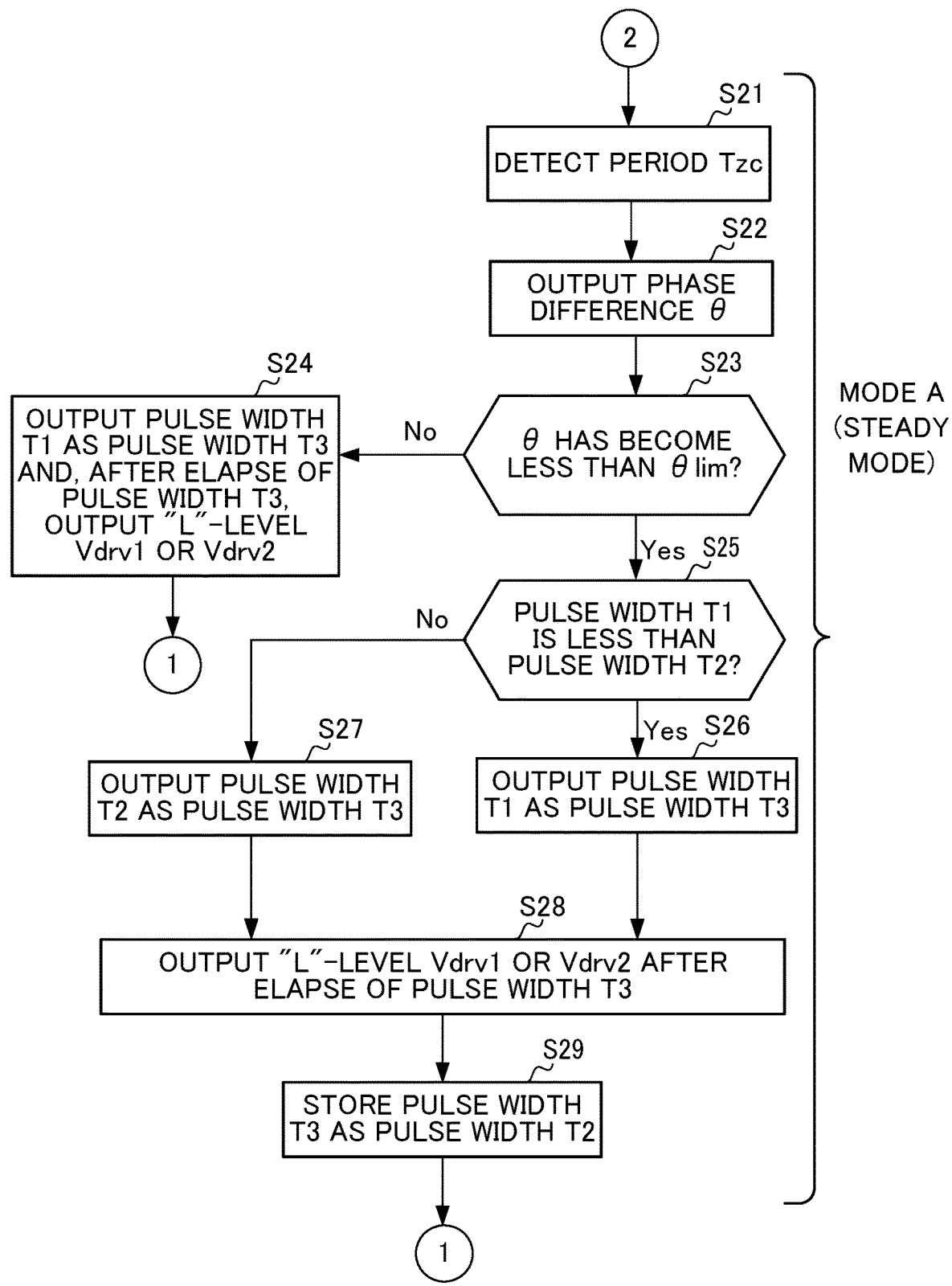
FIG. 9 is a diagram illustrating a flowchart indicating an example of the operation of the control IC 40.

FIGS. 8 and 9 are diagrams illustrating flowcharts indicating examples of the operation of the control IC 40.

First, the operation of the control IC 40 in "mode A" or "mode B" will be briefly described. In the case where the switching power supply circuit 10 is in "mode A" operation, the control IC 40 derives the phase difference θ and, when the phase difference θ becomes less than the predetermined value θlim, the control IC 40 compares "pulse width T1" and "pulse width T2", and the control IC 40 drives the NMOS transistors 22 and 23 with "pulse width T3" which is the smaller pulse width among the "pulse width T1" and "pulse width T2". The control IC 40, then, holds the minimum frequency based on "pulse width T3". From this point, the control IC 40 drives the NMOS transistors 22 and 23 with the minimum frequency when the phase difference θ is less than the predetermined value θlim. In this way, the control IC 40 prevents off-resonance.

Next, in the case where the switching power supply circuit 10 is in "mode B" operation, after one of the NMOS transistors 22 and 23 is turned on for "pulse width T1" and a dead time elapses, the dead time is extended until the resonance current Icr crosses zero and a state where no through-current flows is reached. Here, when the comparators 80 and 81 indicate that the resonance current Icr has passed zero and a state where no through-current flows has been reached, the control IC 40 turns on the another one of NMOS transistors 22 and 23.

In the following, specific operations of the control IC 40 related to the above-described operation will be described using the flowcharts.

Mode Determination Operation

Firstly, the pulse width output circuit 62 outputs "pulse width T1" according to the voltage Vfb in response to the output voltage Vout (S1). Then, the driving signal generation circuit 82 brings the driving signal Vdrv1 or Vdrv2 to the "H" level (S2). Then, the driving signal generation circuit 82 and the timing signal output circuit 72 count the input pulse width (S3).

The timing signal output circuit 72 determines whether the pulse duration of the driving signal Vdrv1 or Vdrv2 has reached the center of the input pulse width (S4). If the pulse duration has not reached the center of the input pulse width (S4: No), the timing signal output circuit 72 continues determining whether the pulse duration of the driving signal Vdrv1 or Vdrv2 has reached the center of the input pulse width (S4).

If the pulse duration has reached the center of the input pulse width (S4: Yes), the mode determination circuit 71 determines whether the resonance current Icr is flowing in the positive direction, that is, determines whether the comparator 70 is outputting the "H"-level signal th1, when the timing signal tim1 is generated (S5). Alternatively, if the pulse duration has reached the center of the input pulse width (S4: Yes), the mode determination circuit 71 determines whether the resonance current Icr is flowing in the negative direction, that is, determines whether the comparator 70 is outputting the "L"-level signal th1, when the timing signal tim2 is generated (S5).

If the resonance current Icr is flowing in the positive direction, that is, the signal th1 is at the "H" level, when the timing signal tim1 is generated, the mode determination circuit 71 determines that the switching power supply circuit 10 is in "mode A" operation (S5: Yes). Also, if the resonance current Icr is flowing in the negative direction, that is, the signal th1 is at the "L" level, when the timing signal tim2 is generated, the mode determination circuit 71 determines that the switching power supply circuit 10 is in "mode A" operation (S5: Yes).

On the other hand, if the resonance current Icr is flowing in the negative direction, that is, the signal th1 is at the "L" level, when the timing signal tim1 is generated, the mode determination circuit 71 determines that the switching power supply circuit 10 is in "mode B" operation (S5: No). Also, if the resonance current Icr is flowing in the positive direction, that is, the signal th1 is at the "H" level, when the timing signal tim2 is generated, the mode determination circuit 71 determines that the switching power supply circuit 10 is in "mode B" operation (S5: No).

Operation when Switching Power Supply Circuit 10 Is in "Mode B" Operation

The switching power supply circuit 10 is in "mode B" operation (S5: No), the driving signal generation circuit 82 determines whether the counting of the input pulse width has been completed (S11).

If the counting of the input pulse width has not been completed (S11: No), the driving signal generation circuit 82 continues determining whether the counting of the input pulse width has been completed (S11). If the counting of the input pulse width has been completed (S11: Yes), the driving signal generation circuit 82 brings the driving signal Vdrv1 or Vdrv2 to the "L" level and starts counting a dead time (S12).

The driving signal generation circuit 82 determines whether the counting of the dead time has been completed (S13). If the counting of the dead time has not been completed (S13: No), the driving signal generation circuit 82 continues determining whether the counting of the dead time has been completed (S13).

If the counting of the dead time has been completed (S13: Yes), the driving signal generation circuit 82 determines whether the resonance current Icr is flowing in the positive direction, that is, determines whether the comparator 80 is outputting the "H"-level signal th2, after the driving signal Vdrv1 shifts to the "L" level (S14). Alternatively, the driving signal generation circuit 82 determines whether the resonance current Icr is flowing in the negative direction, that is, determines whether the comparator 81 is outputting the "L"-level signal th3, after the driving signal Vdrv2 shifts to the "L" level (S14).

If the signal th2 is at the "L" level after the driving signal Vdrv1 shifts to the "L" level or if the signal th3 is at the "H" level after the driving signal Vdrv2 shifts to the "L" level (S14: No), the driving signal generation circuit 82 continues the dead time (S14). At this time, the resonance current Icr gradually gets closer to near zero.

If the signal th2 is at the "H" level after the driving signal Vdrv1 shifts to the "L" level or if the signal th3 is at the "L" level after the driving signal Vdrv2 shifts to the "L" level (S14: Yes), the pulse width output circuit 62 outputs "pulse width T1" according to the voltage Vfb in response to the output voltage Vout (S1). At this time, the resonance current Icr flows in the positive direction in the case after the driving signal Vdrv1 shifts to the "L" level, and flows in the negative direction in the case after the driving signal Vdrv2 shifts to the "L" level.

As described above, in the case where the switching power supply circuit 10 is in "mode B" operation, the driving signal generation circuit 82 turns on the NMOS transistor 23 on the ground side when the resonance current Icr in the negative direction increases and reaches a positive value near zero (reference voltage VREF1). By such a driving operation, the NMOS transistor 23 on the ground side is driven after the resonance current Icr becomes positive. This can reliably prevent a through-current. Note that in the case where the switching power supply circuit 10 is in "mode B" operation, the driving signal generation circuit 82 turns on the NMOS transistor 22 on the power supply side when the resonance current Icr in the positive direction decreases and reaches a negative value near zero (reference voltage VREF2). By such a driving operation, the NMOS transistor 22 on the power supply side is, likewise, driven after the resonance current Icr becomes negative. This can reliably prevent a through-current.

Operation when Switching Power Supply Circuit 10 Is in "Mode A" Operation

FIG. 9 is a diagram illustrating a flowchart indicating an example of the operation of the control IC 40. The operation in the case where the switching power supply circuit 10 is in "mode A" operation will be described below with reference to FIGS. 8 and 9.

In the case where the switching power supply circuit 10 is in "mode A" operation (S5 in FIG. 8: Yes), the detection circuit 65 detects the period Tzc based on the signals S0 and S1 (S21). Also, the divider circuit 66 outputs the phase difference θ (S22). Then, the discrimination circuit 83 determines whether the phase difference θ has become less than the predetermined value θlim (S23).

If the phase difference θ is greater than the predetermined value θlim (S23: No), the output circuit 85 outputs "pulse width T1" as "pulse width T3" and, after the elapse of "pulse width T3", the driving signal generation circuit 82 outputs the "L"-level driving signal Vdrv1 or Vdrv2 (S24). Thereafter, the pulse width output circuit 62 outputs "pulse width T1" according to the voltage Vfb in response to the output voltage Vout, that is, the pulse width output circuit 62 outputs a pulse width in response to the voltage Vfb (S1).

If, on the other hand, the phase difference θ has become less than the predetermined value θlim (S23: Yes), the output circuit 85 determines whether "pulse width T1" is less than "pulse width T2" (S25).

If "pulse width T1" is less than "pulse width T2" (S25: Yes), the output circuit 85 outputs "pulse width T1" as "pulse width T3" (S26). On the other hand, if "pulse width T1" is greater than "pulse width T2" (S25: No), the output circuit 85 outputs "pulse width T2" as "pulse width T3" (S27).

In sum, in steps S25, S26, and S27, the output circuit 85 performs control such that the control IC 40 outputs the signal Vdr1 or Vdr2 with the higher frequency among the frequency based on "pulse width T1" and the frequency based on "pulse width T2".

The driving signal generation circuit 82 then outputs the "L"-level driving signal Vdrv1 or Vdrv2 after the elapse of "pulse width T3" (S28). Then, the storage circuit 84 stores "pulse width T3" as "pulse width T2" (S29). Thereafter, the pulse width output circuit 62 outputs "pulse width T1" according to the voltage Vfb in response to the output voltage Vout, that is, the pulse width output circuit 62 outputs a pulse width in response to the voltage Vfb (S1).

Non-Steady Operation of Switching Power Supply Circuit 10

Figure 10:
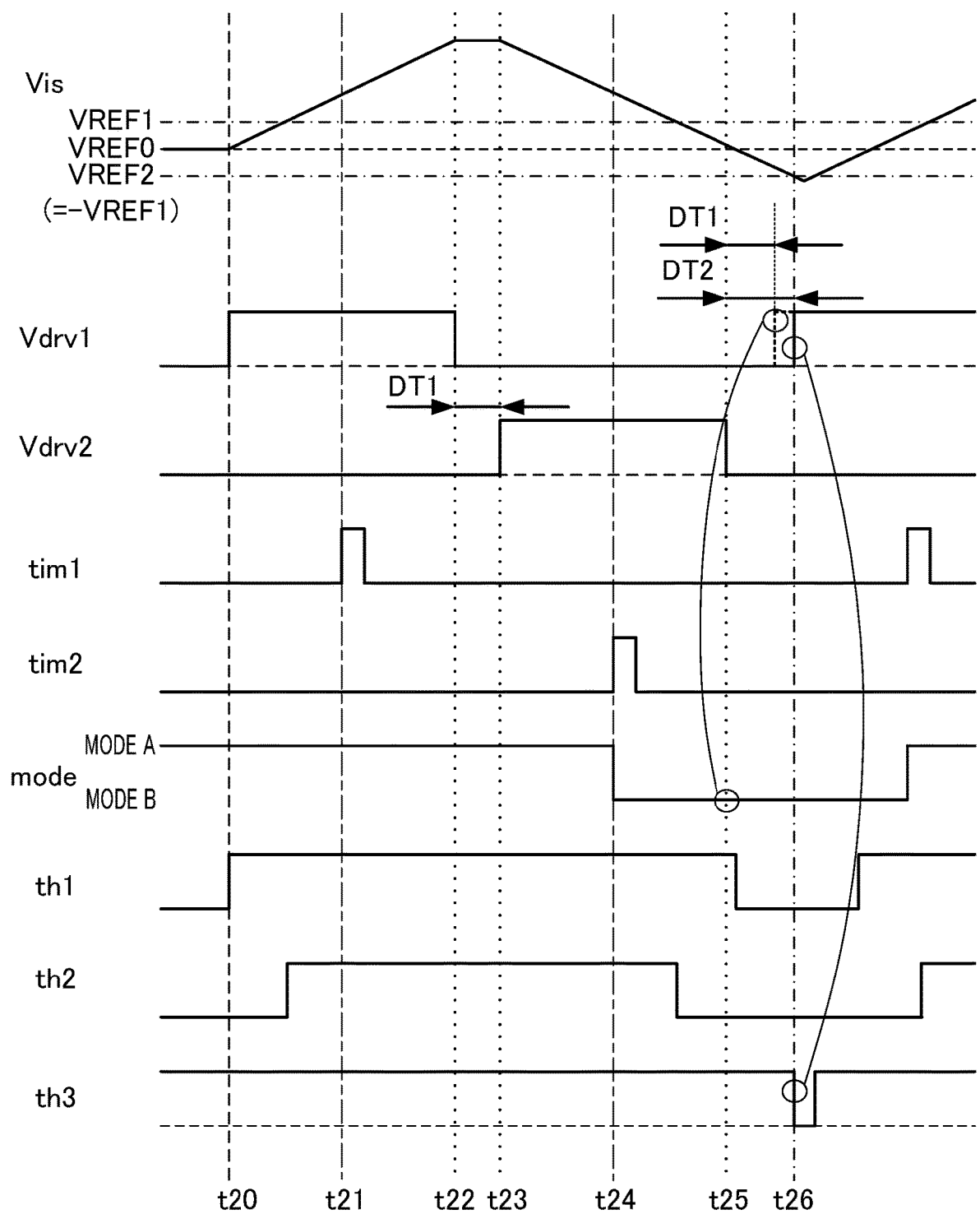
FIG. 10 is a diagram illustrating an example of the operation of the control IC 40 during non-steady operation.

FIG. 10 is a diagram illustrating a timing chart indicating an example of the operation of the control IC 40 during a non-steady operation. Note that FIG. 10 is a diagram for explaining the operation of the control IC 40 for suppressing the through-current during non-steady operation of the switching power supply circuit 10 explained in FIG. 4.

Assume that, before a time t20, the switching power supply circuit 10 has not yet been started and the mode determination circuit 71 in this embodiment outputs the signal mode indicating "mode A" as an initial value.

At the time t20, when the switching power supply circuit 10 is started, the driving signal generation circuit 82 outputs the "H"-level driving signal Vdrv1.

At a time t21, the timing signal output circuit 72 outputs the timing signal tim1 indicating that the center of the input pulse width has been reached since the output of the "H"-level driving signal Vdrv1. At this time, since the comparator 70 is outputting the "H"-level signal th1 and the resonance current Icr in the positive direction is flowing (that is, the voltage Vis is a positive voltage), the mode determination circuit 71 therefore outputs the signal mode indicating "mode A".

At a time t22 after the elapse of the input pulse width from the time t20, the driving signal generation circuit 82 outputs the "L"-level driving signal Vdrv1.

At a time t23 after the elapse of a dead time DT1 from the time t22, the driving signal generation circuit 82 outputs the "H"-level driving signal Vdrv2. Note that, at the time t23, the dead time DT1 is a predetermined dead time, and is not extended based on the signal mode indicating that the switching power supply circuit 10 is in "mode A" operation.

At a time t24, the timing signal output circuit 72 outputs the timing signal tim2 indicating that the center of the input pulse width has been reached since the output of the "H"-level driving signal Vdrv2. At this time, the comparator 70 is outputting the "H"-level signal th1 and the resonance current Icr in the positive direction is flowing (that is, the voltage Vis is a positive voltage), and the mode determination circuit 71 therefore outputs the signal mode indicating "mode B".

At a time t25 after the elapse of the input pulse width from the time t23, the driving signal generation circuit 82 outputs the "L"-level driving signal Vdrv2.

At a time t26 after the elapse of a dead time DT2 from the time t25, the comparator 81 outputs the "L"-level signal th3 indicating that the resonance current Icr is flowing in the negative direction, that is, the magnitude of the voltage Vis in response to the resonance current Icr has become less than the reference voltage VREF2.

The driving signal generation circuit 82 outputs the "H"-level driving signal Vdrv1 based on the signal mode indicating the switching power supply circuit 10 is in mode B operation and the "L"-level signal th3. Note that the dead time DT2 is extended to the time t26 based on the signal mode indicating that the switching power supply circuit 10 is in "mode B" operation, and is longer than the predetermined dead time DT1.

In other words, in the case where the switching power supply circuit 10 is in mode B operation, the control IC 40 does not output the "H"-level driving signal Vdrv1 after the elapse of the dead time DT1, as indicated by the dotted line. Instead, the control IC 40 outputs the "H"-level driving signal Vdrv1 when the comparator 81 outputs the "L"-level signal th3 after the elapse of the dead time DT1, as indicated by the solid line. Accordingly, in this embodiment, the generation of the through-current explained in FIG. 4 can be prevented.

Figure 11:
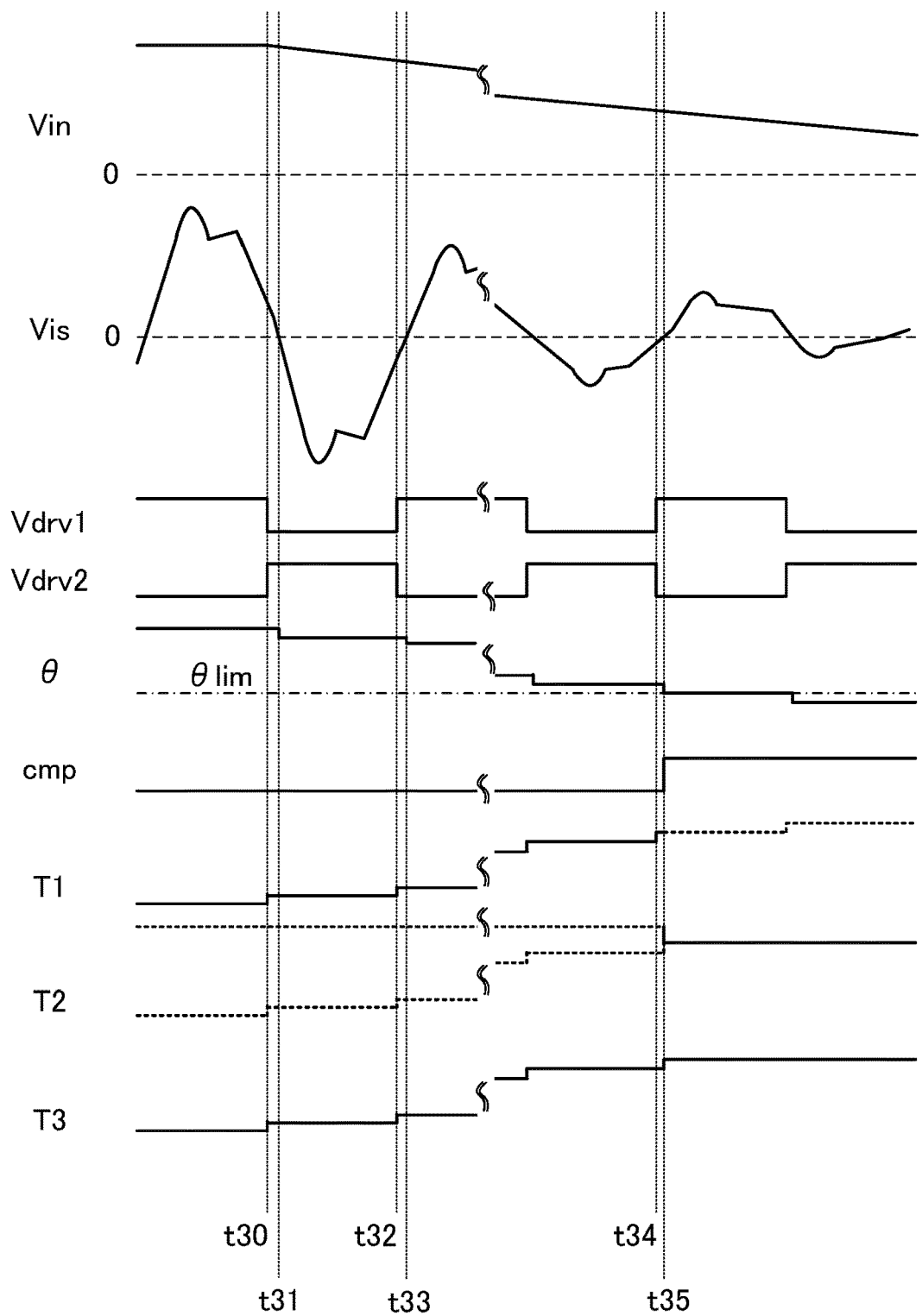
FIG. 11 is a diagram explaining an example of the operation of the control IC 40 when an input voltage drops during steady operation.

Description of Operation of Control IC 40 When Input Voltage Drops During Steady Operation FIG. 11 is a diagram explaining an example of the operation of the control IC 40 when the input voltage drops during steady operation. Assume that the input voltage Vin gradually drops from a time t30. Also, the change in the output voltage Vout with the drop in the input voltage Vin is actually gentle and, for example, the change in "pulse width T1" in response to the voltage Vfb is also gentle as compared to the switching frequency of the switching power supply circuit 10. However, to facilitate understanding of the operation of the control IC 40, signals and the like in FIG. 11 are depicted to change greatly with time for convenience.

At the time t30, the control IC 40 outputs the "H"-level driving signal Vdrv2. The control IC 40 lowers the switching frequency to raise the gain (Vout/Vin) so that the switching power supply circuit 10 can output the output voltage Vout of the target level. Specifically, the pulse width output circuit 62 increases "pulse width T1".

At a time t31, the voltage Vis indicating the direction of the resonance current Icr changes from a positive voltage to a negative voltage, that is, the polarity of the resonance current Icr reverses. Also, as the switching frequency decreases, the influence of the capacitor 21 becomes greater than the primary coil L1. Accordingly, the period Tzc detected by the detection circuit 65 becomes shorter than the period Tzc at or before the time t30. Also, the divider circuit 66 outputs the phase difference θ based on the period Tzc and "pulse width T3" being "pulse width T1". At this time, the phase difference θ has become less than the phase difference θ at or before the time t30.

At a time t32, the control IC 40 outputs the "H"-level driving signal Vdrv1. Since the input voltage Vin has further dropped as compared to before the time t32, the control IC 40 further reduces the switching frequency and the pulse width output circuit 62 widens "pulse width T1".

At a time t33, the voltage Vis indicating the direction of the resonance current Icr changes from a negative voltage to a positive voltage, that is, the polarity of the resonance current Icr reverses. The period Tzc detected by the detection circuit 65 becomes shorter than the period Tzc at the time t31. Then, the divider circuit 66 outputs the phase difference θ based on the period Tzc and "pulse width T3" being "pulse width T1". At this time, the phase difference θ has become less than the phase difference θ at the time t31.

At a time t34, the control IC 40 outputs the "H"-level driving signal Vdrv1. Since the input voltage Vin has further dropped as compared to before the time t34, the control IC 40 further reduces the switching frequency and the pulse width output circuit 62 widens "pulse width T1".

At a time t35, the voltage Vis indicating the direction of the resonance current Icr changes from a negative voltage to a positive voltage, that is, the polarity of the resonance current Icr reverses. The period Tzc detected by the detection circuit 65 becomes shorter than the period Tzc at the time t33. Then, the divider circuit 66 outputs the phase difference θ based on the period Tzc and "pulse width T3" being "pulse width T1". At this time, the phase difference θ has become less than the phase difference θ at the time t33. Then, if the discrimination circuit 83 discriminates that the phase difference θ has become less than the predetermined value θlim, the output circuit 85 determines whether "pulse width T1" is less than "pulse width T2". Then, the output circuit 85 outputs the smaller pulse width among "pulse width T1" and "pulse width T2" as "pulse width T3". Thereafter, the storage circuit 84 stores "pulse width T3" as "pulse width T2".

After this, the output circuit 85 outputs "pulse width T2" as "pulse width T3" even when the input voltage Vin drops further. Since the driving signal generation circuit 82 outputs the driving signals Vdrv1 and Vdrv2 based on "pulse width T3", the switching frequency of the switching power supply circuit 10 will not decrease. That is, the control IC 40 outputs the signals Vdr1 and Vdr2 with the minimum frequency limited. Thus, the control IC 40 outputs the signals Vdr1 and Vdr2 with the minimum frequency limited even when the input voltage Vin drops further. Accordingly, the switching power supply circuit 10 can more reliably prevent off-resonance.

Figure 12:
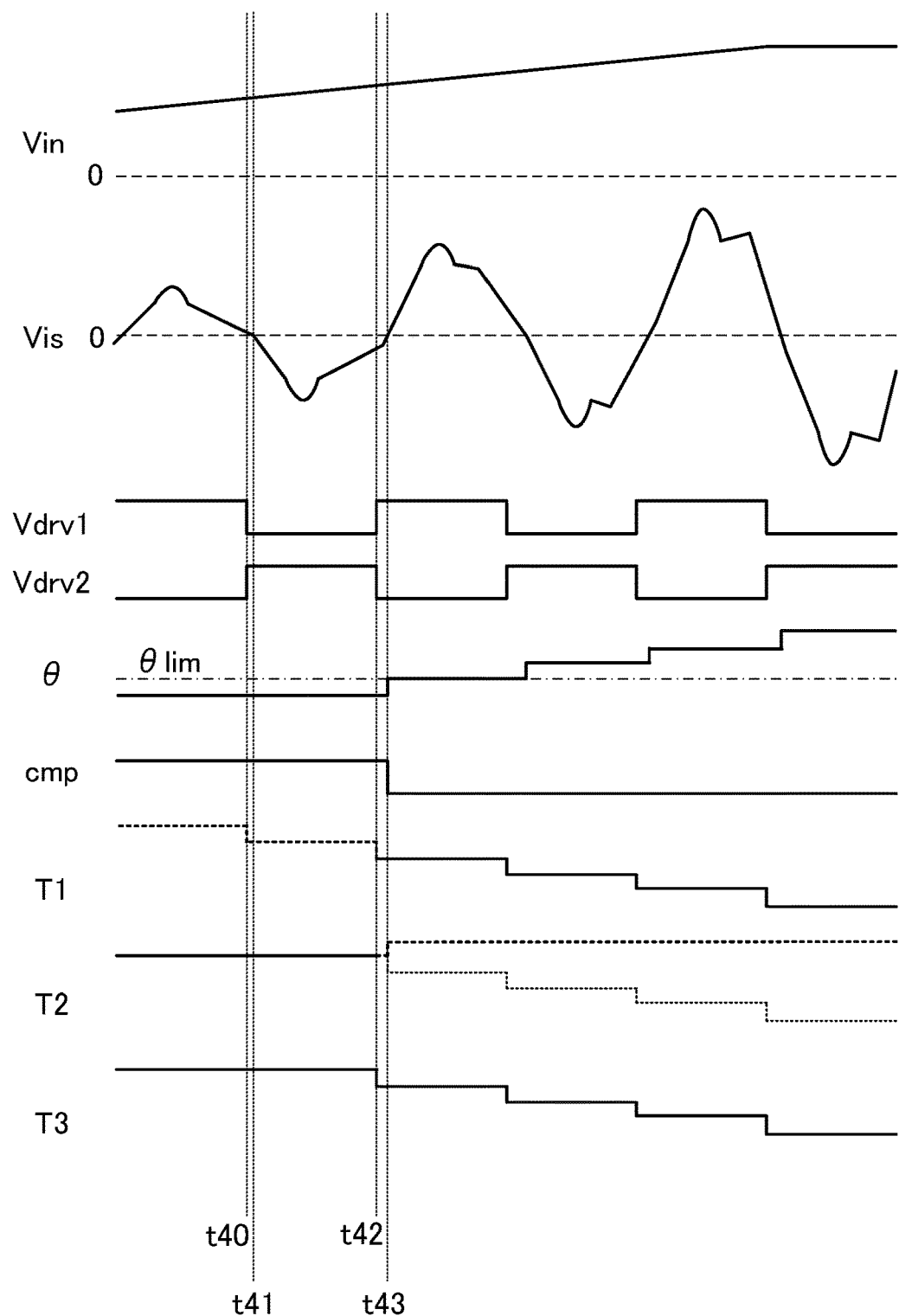
FIG. 12 is a diagram explaining an example of the operation of the control IC 40 when the input voltage drops and then rises during steady operation.

Description of Operation of Control IC 40 When Input Voltage Rises During Steady Operation FIG. 12 is a diagram explaining an example of the operation of the control IC 40 when the input voltage drops and then rises during steady operation. Assume that the input voltage Vin has gradually risen before a time t40. Also, the change in the output voltage Vout with the rise in the input voltage Vin is actually gentle and, for example, the change in "pulse width T1" in response to the voltage Vfb is also gentle as compared to the switching frequency of the switching power supply circuit 10. However, to facilitate understanding of the operation of the control IC 40, signals and the like in FIG. 12 are depicted to change greatly with time for convenience, as with FIG. 11.

At the time t40, the control IC 40 outputs the "H"-level driving signal Vdrv2. Since the input voltage Vin has risen, the control IC 40 attempts to raise the switching frequency to reduce the gain (Vout/Vin) so that the switching power supply circuit 10 can output the output voltage Vout of the target level. Specifically, the pulse width output circuit 62 decreases "pulse width T1".

However, the phase difference θ at this time is still less than the predetermined value θlim. Thus, the output circuit 85 is outputting "pulse width T2", which is "pulse width T3 at the point when the phase difference θ becomes less than the predetermined value θlim, as "pulse width T3". Accordingly, the switching frequency does not change.

At a time t41, the voltage Vis indicating the direction of the resonance current Icr changes from a positive voltage to a negative voltage, that is, the polarity of the resonance current Icr reverses. At this time, the input voltage Vin is rising, but the period Tzc does not change since the switching frequency is not changing. Accordingly, the phase difference θ does not change either.

At a time t42, the control IC 40 outputs the "H"-level driving signal Vdrv1. Also, since the input voltage Vin has further risen as compared to before the time t42, the control IC 40 attempts to further raise the switching frequency and the pulse width output circuit 62 narrows "pulse width T1". At this time, the output circuit 85 detects that "pulse width T1" has become less than "pulse width T2", and outputs "pulse width T1" as "pulse width T3".

At a time t43, the voltage Vis indicating the direction of the resonance current Icr changes from a negative voltage to a positive voltage, that is, the polarity of the resonance current Icr reverses. At this time, the input voltage Vin is rising, and the switching frequency is the frequency based on "pulse width T1". Also, as the switching frequency rises, the influence of the primary coil L1 becomes greater than the capacitor 21.

Accordingly, the period Tzc detected by the detection circuit 65 becomes longer than the period Tzc at the time t41. Then, the divider circuit 66 outputs the phase difference θ based on the period Tzc and "pulse width T3" being "pulse width T1". At this time, the phase difference θ has become greater than the phase difference θ at the time t41. The discrimination circuit 83 then discriminates that the phase difference θ has become greater than the predetermined value θlim, and resets the discrimination result cmp. When the discrimination circuit 83 resets the discrimination result cmp, the storage circuit 84 resets "pulse width T2".

Modification

Figure 13:
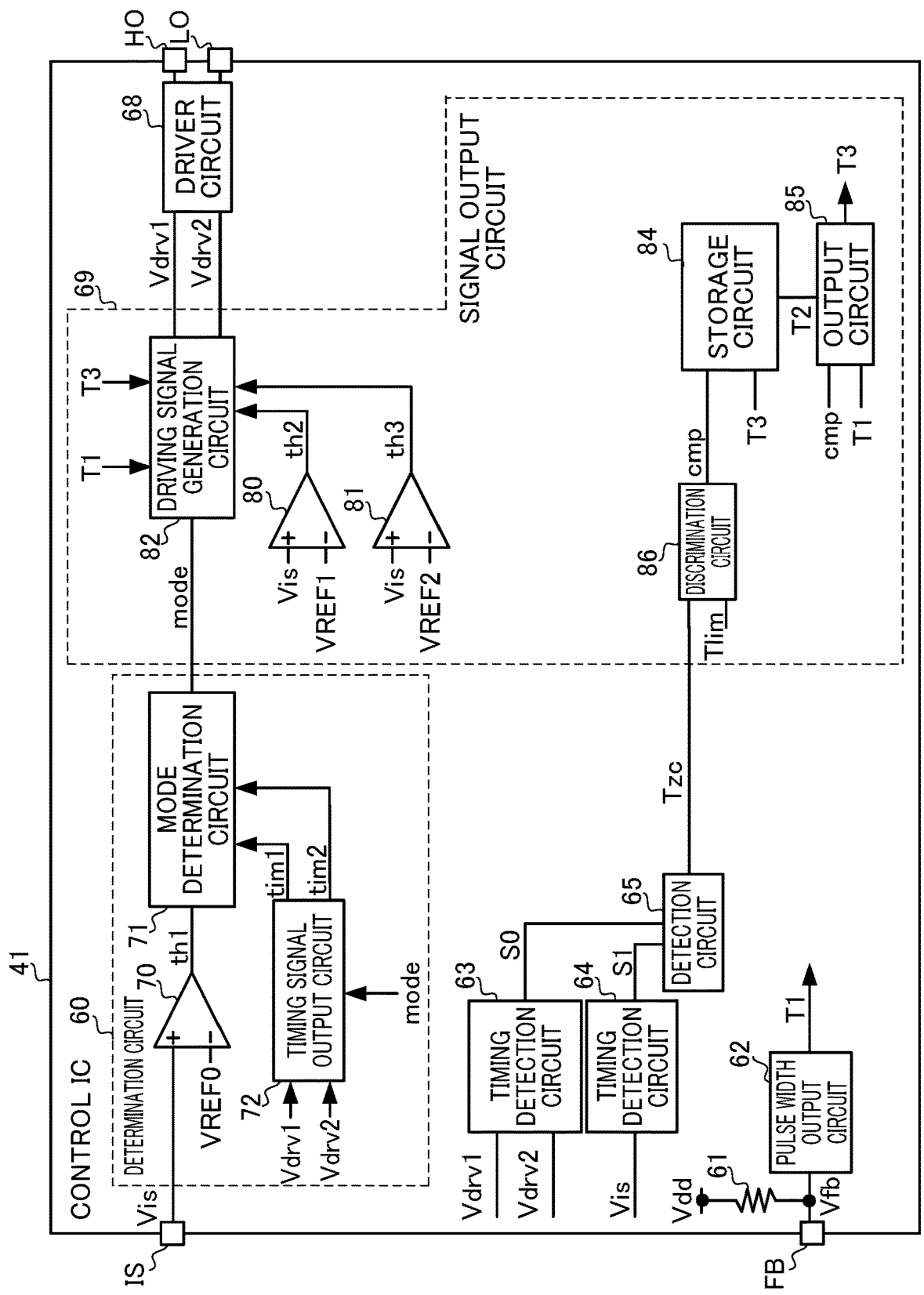
FIG. 13 is a diagram illustrating an example of the configuration of a control IC 41.

FIG. 13 is a diagram illustrating an example of the configuration of a control IC 41. The control IC 41 represents a modification of the control IC 40. The control IC 41 represents a modification without the divider circuit 66 in the control IC 40. Also, in this case, the control IC 41 includes a discrimination circuit 86 that compares the period Tzc and a predetermined value Tlim, in place of the discrimination circuit 83, within a signal output circuit 69. Also, the signal output circuit 69 represents a modification of the signal output circuit 67. The other components in the control IC 41 are the same as those in the control IC 40 and are denoted by the same reference signs. Also, description of the same components is omitted.

The discrimination circuit 86 discriminates whether the period Tzc has become so short as to satisfy a predetermined condition. Specifically, the discrimination circuit 86 compares the period Tzc and the predetermined value Tlim, and outputs a discrimination result cmp when the period Tzc becomes less than the predetermined value Tlim. The discrimination circuit 86 resets the discrimination result cmp when the period Tzc becomes greater than the predetermined value Tlim. Thus, the control IC 41 causes the switching power supply circuit 10 to operate so as to prevent off-resonance based on the difference between the timing at which one of the NMOS transistors 22 and 23 is turned on and the timing at which the polarity of the resonance current Icr reverses.

Summary

The switching power supply circuit 10 according to this embodiment has been described above. The detection circuit 65 detects the period Tzc between the timing at which one of the NMOS transistor 22 or 23 is turned on and the timing at which the polarity of the resonance current Icr changes. Also, the signal output circuit 67 outputs the driving signal Vdrv1 or Vdrv2 with its minimum frequency (e.g., a reciprocal of "pulse width T2") limited, when the difference becomes so small as to satisfy a predetermined condition. In this way, the control IC 40 can prevent off-resonance based on the phase difference between the voltage applied to the resonant circuit including the primary coil L1 and the capacitor 21 and the resonance current. Accordingly, it is possible to provide a switching control circuit that more reliably prevents off-resonance.

Also, the minimum frequency is the frequency of the driving signal at a point when the difference satisfies the predetermined condition (reciprocal of "pulse width T1"). In this way, the control IC 40 can prevent the switching frequency from becoming a frequency in a capacitive region even when the relationship between the switching frequency and the gain of the switching power supply circuit 10 is unknown. That is, the control IC 40 can more reliably prevent the switching power supply circuit 10 from falling into off-resonance.

Also, the predetermined condition is that the phase difference θ in response to the period Tzc becomes less than the predetermined value θlim. In this way, the control IC 40 more easily prevents off-resonance.

Also, the divider circuit 66 divides the period Tzc by "pulse width T3" and outputs the phase difference θ. In this way, the minimum frequency (reciprocal of "pulse width T2") can be determined with frequency information taken into account.

Also, instead of the phase difference θ, the period Tzc can be used to determine the minimum frequency.

Also, the signal output circuit 67 includes the discrimination circuit 83, the storage circuit 84, and the output circuit 85. In this way, a minimum frequency for more reliably preventing off-resonance is determined with a simple circuit.

Also, the determination circuit 60 determines the operation mode in which the switching power supply circuit 10 operates between the mode A and the mode B based on the resonance current Icr of the switching power supply circuit 10. In this way, the control IC 40 can more reliably prevent off-resonance regardless of in which operation mode the switching power supply circuit 10 operates.

Also, the determination circuit 60 determines the operation mode based on the resonance current Icr at a predetermined timing in an input pulse width in which the NMOS transistor 22 is turned on. In this way, the operation mode of the switching power supply circuit 10 can be determined successively.

Also, the determination circuit 60 determines the operation mode based on the resonance current Icr at the predetermined timing and the resonance current Icr at the second predetermined timing in an input pulse width in which the NMOS transistor 23 is turned on. In this way, the operation mode can be determined reliably.

Also, the comparator 70 detects the direction of the resonance current Icr and, at the predetermined timing and the second predetermined timing, the mode determination circuit 71 determines whether the switching power supply circuit 10 is in "mode A" operation or in "mode B" operation based on the direction of the resonance current Icr. In this way, a through-current can be suppressed regardless of whether the switching power supply circuit 10 is in a startup or normal operation.

The present invention is directed to provision of a switching control circuit that more reliably prevents off-resonance.

According to the present invention, it is possible to provide a switching control circuit that more reliably prevents off-resonance.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. A switching control circuit that controls switching of a switching device, which controls a resonance current of a resonant converter, with a frequency in response to an output voltage of the resonant converter, the switching control circuit comprising:
   a detection circuit configured to detect a difference between a first timing at which the switching device is turned on and a second timing at which a polarity of the resonance current reverses; and
   a signal output circuit configured to output a driving signal with a preset minimum frequency, responsive to the difference becoming so small as to satisfy a predetermined condition.

2. The switching control circuit according to claim 1, wherein the preset minimum frequency is set to be a frequency of the driving signal at a point when the difference satisfies the predetermined condition.

3. The switching control circuit according to claim 1, wherein the predetermined condition is that a value in response to the difference becomes less than a predetermined value.

4. The switching control circuit according to claim 3, further comprising a divider circuit configured to output a division result obtained by dividing the difference by a period for which the switching device is turned on or off, wherein
   the value in response to the difference is the division result.

5. The switching control circuit according to claim 3, wherein the value in response to the difference is a value of the difference detected by the detection circuit.

6. The switching control circuit according to claim 2, wherein the signal output circuit includes:
   a discrimination circuit configured to discriminate whether the difference has become so small as to satisfy the predetermined condition;
   a storage circuit configured to store the frequency of the driving signal as the preset minimum frequency based on a discrimination result indicating that the difference has become so small as to satisfy the predetermined condition; and
   an output circuit configured to output the driving signal with a higher frequency between the preset minimum frequency and the frequency in response to the output voltage of the resonant converter.

7. The switching control circuit according to claim 1, further comprising
   a determination circuit configured to, based on the resonance current, determine an operation mode of the resonant converter between a first mode for a steady state and a second mode for a state different from the steady state,
   wherein the signal output circuit outputs the driving signal with the preset minimum frequency in a case where the resonant converter operates in the first mode.

8. The switching control circuit according to claim 7, wherein
   said switching device includes a first switching device on a power supply side of the resonant converter and a second switching device on a ground side of the resonant converter,
   the first timing is a timing at which the first switching device or the second switching device is turned on, and
   the determination circuit determines the operation mode based on the resonance current at a third timing in a period in which the first switching device is turned on.

9. The switching control circuit according to claim 8, wherein the determination circuit determines the operation mode based on both the resonance current at the third timing and the resonance current at a fourth timing in a period in which the second switching device is turned on.

10. The switching control circuit according to claim 9, wherein
    the resonant converter includes a resonant circuit; and
    the determination circuit includes:
    a direction detection circuit configured to detect whether the resonance current is in
       a positive direction, in which the resonance current flows from a connecting point between the first switching device and the second switching device to the resonant circuit of the resonant converter, or
       a negative direction, in which the resonance current flows from the resonant circuit to the connecting point; and
    a mode determination circuit configured to
       at the third timing, determine that the operation mode is the first mode if the resonance current is in the negative direction, and determine that the operation mode is the second mode if the resonance current is in the positive direction, and
       at the fourth timing, determine that the operation mode is the first mode if the resonance current is in the positive direction, and determine that the operation mode is the second mode if the resonance current is in the negative direction.

11. A resonant converter comprising:
    a switching device; and
    a switching control circuit configured to control switching of the switching device with a frequency in response to an output voltage of the resonant converter, wherein
    the switching control circuit includes
       a detection circuit configured to detect a difference between a first timing at which the switching device is turned on and a second timing at which a polarity of a resonance current reverses, and
       a signal output circuit configured to output a driving signal with a preset minimum frequency, responsive to the difference becoming so small as to satisfy a predetermined condition.

* * * * *